(12) United States Patent
Fujii et al.

(10) Patent No.: US 10,910,492 B2
(45) Date of Patent: Feb. 2, 2021

(54) SEMICONDUCTOR DEVICE AND METHOD FOR MANUFACTURING THE SAME

(71) Applicant: Renesas Electronics Corporation, Tokyo (JP)

(72) Inventors: Hiroki Fujii, Hitachinaka (JP); Atsushi Sakai, Tokyo (JP); Takahiro Mori, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 120 days.

(21) Appl. No.: 16/036,489

(22) Filed: Jul. 16, 2018

(65) Prior Publication Data

US 2019/0067470 A1 Feb. 28, 2019

(30) Foreign Application Priority Data

Aug. 31, 2017 (JP) .................................. 2017-166911

(51) Int. Cl.
*H01L 29/78* (2006.01)
*H01L 21/8238* (2006.01)
(Continued)

(52) U.S. Cl.
CPC .. *H01L 29/7816* (2013.01); *H01L 21/823431* (2013.01); *H01L 21/823493* (2013.01);
(Continued)

(58) Field of Classification Search
CPC ............. H01L 29/7816; H01L 29/6681; H01L 29/823493; H01L 29/823892; H01L 29/36;
(Continued)

(56) References Cited

U.S. PATENT DOCUMENTS 7,468,537 B2 * 12/2008 Pendharkar ......... H01L 29/0878
257/334
8,470,658 B2 * 6/2013 Kim ................ H01L 21/823412
438/209
(Continued)

OTHER PUBLICATIONS

European Search Report dated Jan. 31, 2019 for European Patent Application No. 18185723-.6-1212.
(Continued)

*Primary Examiner* — Jose R Diaz
(74) *Attorney, Agent, or Firm* — McDermott Will & Emery LLP

(57) ABSTRACT

A semiconductor device which can secure a high breakdown voltage and to which a simplified manufacturing process is applicable and a method for manufacturing the semiconductor device are provided. An $n^+$ buried region has a floating potential. An n-type body region is located on a first surface side of the $n^+$ buried region. A $p^+$ source region is located in the first surface and forms a p-n junction with the n-type body region. A $p^+$ drain region is located in the first surface spacedly from the $p^+$ source region. A p-type impurity region PIR is located between the $n^+$ buried region and the n-type body region and isolates the $n^+$ buried region and the n-type body region from each other.

12 Claims, 18 Drawing Sheets

(51) Int. Cl.
| | |
|---|---|
| *H01L 21/8234* | (2006.01) |
| *H01L 29/06* | (2006.01) |
| *H01L 29/423* | (2006.01) |
| *H01L 29/66* | (2006.01) |
| *H01L 29/10* | (2006.01) |
| *H01L 29/08* | (2006.01) |
| *H01L 27/092* | (2006.01) |
| *H01L 27/06* | (2006.01) |
| *H01L 21/8249* | (2006.01) |
| *H01L 29/732* | (2006.01) |

(52) U.S. Cl.
CPC ......... *H01L 21/823821* (2013.01); *H01L 21/823892* (2013.01); *H01L 27/092* (2013.01); *H01L 29/0653* (2013.01); *H01L 29/0878* (2013.01); *H01L 29/1083* (2013.01); *H01L 29/4238* (2013.01); *H01L 29/42376* (2013.01); *H01L 29/66681* (2013.01); *H01L 29/7834* (2013.01); *H01L 29/7835* (2013.01); *H01L 29/7851* (2013.01); *H01L 21/8249* (2013.01); *H01L 27/0623* (2013.01); *H01L 27/0922* (2013.01); *H01L 29/7322* (2013.01)

(58) Field of Classification Search
CPC ............ H01L 29/1033; H01L 29/7835; H01L 29/7841; H01L 21/823493; H01L 21/823431; H01L 21/74; H01L 29/7833; H01L 29/783; H01L 29/66659; H01L 29/0856–086; H01L 29/0873–0878; H01L 29/1095; H01L 21/823892; H01L 27/0928
See application file for complete search history.

(56) References Cited

U.S. PATENT DOCUMENTS

| | | | |
|---|---|---|---|
| 9,978,867 | B1* | 5/2018 | Hung ............... H01L 21/76202 |
| 2011/0073944 | A1 | 3/2011 | Tsukihara |
| 2013/0307072 | A1 | 11/2013 | Huang et al. |
| 2013/0313639 | A1 | 11/2013 | Shirai |

OTHER PUBLICATIONS

Mun Nam Chil et al., "Advanced 300mm 130nm BCD Technology from 5V to 85V with Deep-Trench Isolation", ISPSD2016, pp. 403-406, 2016.

John Ellis-Monaghan et al., "A 90 to 170V Scalable P-LDMOS with Accompanied High Voltage PJFET", ISPSD2012, pp. 129-132, 2012.

Carsten Schmidt et al., "Increasing Breakdown Voltage of p-Channel LDMOS in BCD Technology with Novel Backside Process", ISPSD2017, pp. 339-342, 2017.

* cited by examiner

SEMICONDUCTOR DEVICE AND METHOD FOR MANUFACTURING THE SAME

CROSS-REFERENCE TO RELATED APPLICATIONS

The disclosure of Japanese Patent Application No. 2017-166911 filed on Aug. 31, 2017 including the specification, drawings and abstract is incorporated herein by reference in its entirety.

BACKGROUND

The present invention relates to a semiconductor device and a method for manufacturing the same.

BiC-DMOSs (Bipolar Complementary Metal Oxide Semiconductors) in which both LDMOSs (Laterally Diffused Metal Oxide Semiconductors) and CMOSs (Complementary Metal Oxide Semiconductors) are included are used in, for example, automobiles, motor drivers and audio amplifiers. For example, for LDMOS transistors included in BiC-DMOSs used for monitoring vehicle-mounted batteries, there has been demand for higher breakdown voltage.

Such an LDMOS transistor is described, for example, in Non-Patent literature 1, Mun Nam Chil et al., "Advanced 300 mm 130 nm BCD technology from 5V to 85V with Deep-Trench Isolation", ISPSD2016, pp. 403-406, 2016. The back-gate structure of the LDMOS transistor includes an n-type buried region (NBL), an n-type epitaxial layer (N-EPI) coupled to the n-type buried region (NBL), and an n-type body region (N-Body) coupled to the n-type epitaxial layer (N-EPI).

The back-gate structure of the LDMOS transistor described in Non-Patent literature 2, John Ellis-Monaghan et al., "A 90 to 170V scalable P-LDMOS with accompanied high voltage PJFET", ISPSD2012, pp. 129-132, 2012, includes an n-well region (Lightly Doped Nwell) and an n-well region (Nwell) coupled to the n-well region (Lightly Doped Nwell).

In the LDMOS transistor described in Non-Patent literature 3, Carsten Schmidt et al., "Increasing Breakdown Voltage of p-Channel LDMOS in BCD Technology with Novel Backside", ISPSD2017, pp. 339-342, 2017, includes an n-type region added on the back side to increase the breakdown voltage of an under-drain region. The n-type region is in contact with a metal electrode formed on the back side.

SUMMARY

In the LDMOS transistor described in the above Non-Patent literature 1, the potential of the n-type body region (N-Body) to be made a back gate approximately equals the potential of the n-type buried region (NBL). Therefore, the breakdown voltage in the depth direction between the drain and the n-type buried region (NBL) cannot be increased.

In the LDMOS transistor described in the above Non-Patent literature 2, no n-type buried region (NBL) is included. Therefore, punching-through occurs early between the n-well region (Lightly Doped Nwell) and the p-type substrate region (p-type SX), so that a high breakdown voltage cannot be secured.

The LDMOS transistor described in Non-Patent literature 3 requires an n-type region to be additionally formed on the back side and this complicates the manufacturing process.

Other objects and novel features of the present invention will become apparent from the following description of this specification and the attached drawings.

The semiconductor device according to an embodiment of the present invention has a first insulated-gate field-effect transistor and includes a semiconductor substrate, a first buried region of a first conductivity type, a first body region of the first conductivity type, a source region of a second conductivity type, a drain region of the second conductivity type, and a first impurity region of the second conductivity type. The semiconductor substrate includes a first surface and a second surface opposing each other. The first buried region is located in the semiconductor substrate to be in a region where the first insulated-gate field-effect transistor is formed and has a floating potential. The first body region is located on the first surface side of the first buried region. The source region is located in the first surface and forms a p-n junction with the first body region. The drain region is located in the first surface spacedly from the source region. The first impurity region is located between the first buried region and the first body region and isolates the first buried region and the first body region from each other.

A semiconductor device manufacturing method according to an embodiment of the present invention is for manufacturing a semiconductor device having a first insulated-gate field-effect transistor and includes the following steps.

A first buried region of a first conductivity type having a floating potential is formed in a semiconductor substrate having a first surface and a second surface which oppose each other such that the first buried region is located in a region where a first insulated-gate field-effect transistor is formed. A first body region of the first conductivity type is formed on the first surface side of the first buried region. A source region of a second conductivity type forming a p-n junction with the first body region and a drain region of the second conductivity type are formed, spacedly from each other, in the first surface. A first impurity region of the second conductivity type is formed between the first buried region and the first body region, the first impurity region isolating the first buried region and the first body region from each other.

According to the above embodiment, a semiconductor device which can secure a high breakdown voltage and which can be manufactured through a simplified manufacturing process and a method for manufacturing the semiconductor device can be realized.

DETAILED DESCRIPTION

Embodiments of the present invention will be described below based on the attached drawings.

First Embodiment

Figure 1:
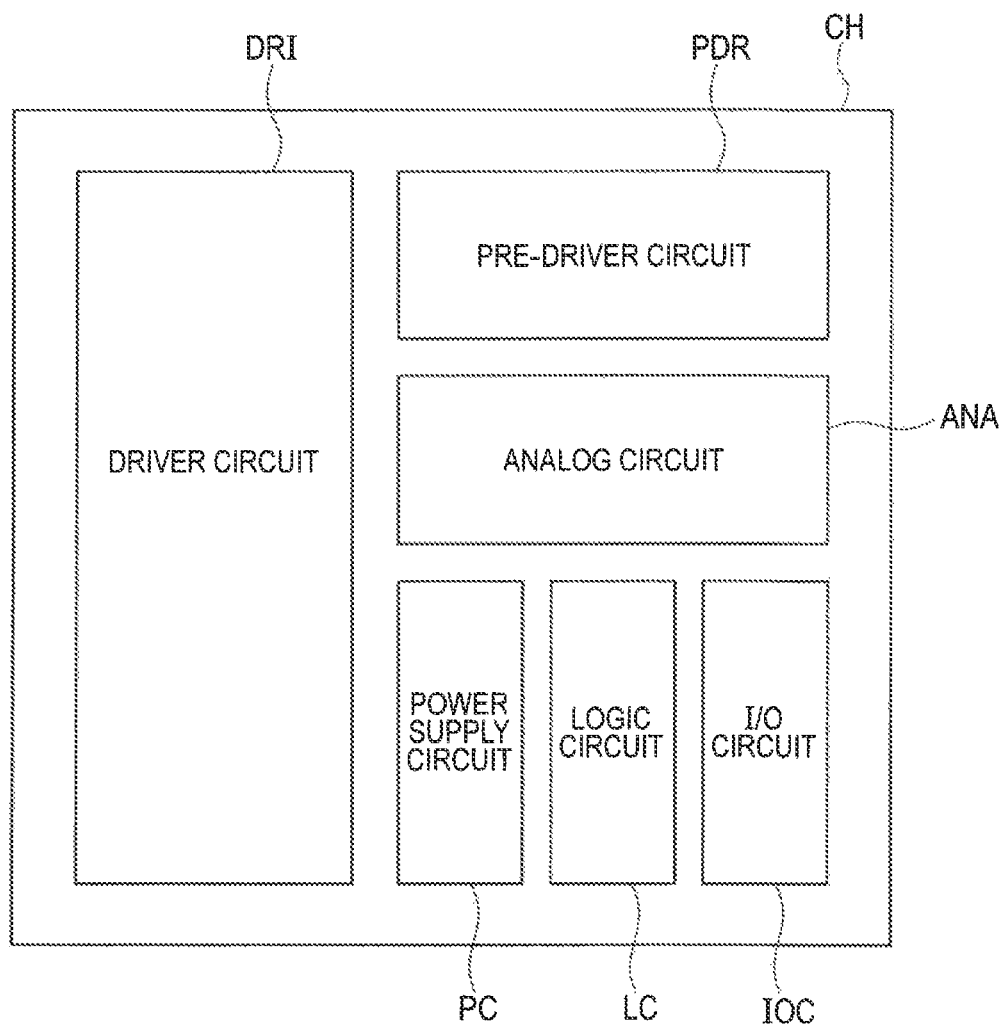
FIG. 1 is a plan view schematically showing the structure of a semiconductor device formed as a chip according to a first embodiment of the present invention.

As shown in FIG. 1, a semiconductor device CH according to a first embodiment of the present invention is formed, for example, as a chip and includes a semiconductor substrate. The front surface of the semiconductor substrate includes regions where a driver circuit DRI, a pre-driver circuit PDR, an analog circuit ANA, a power supply circuit PC, a logic circuit LC and an I/O circuit IOC are formed, respectively.

The semiconductor device of the present embodiment is not limited to a semiconductor chip and may also be formed, for example, as a wafer or a package sealed with resin.

Figure 2:
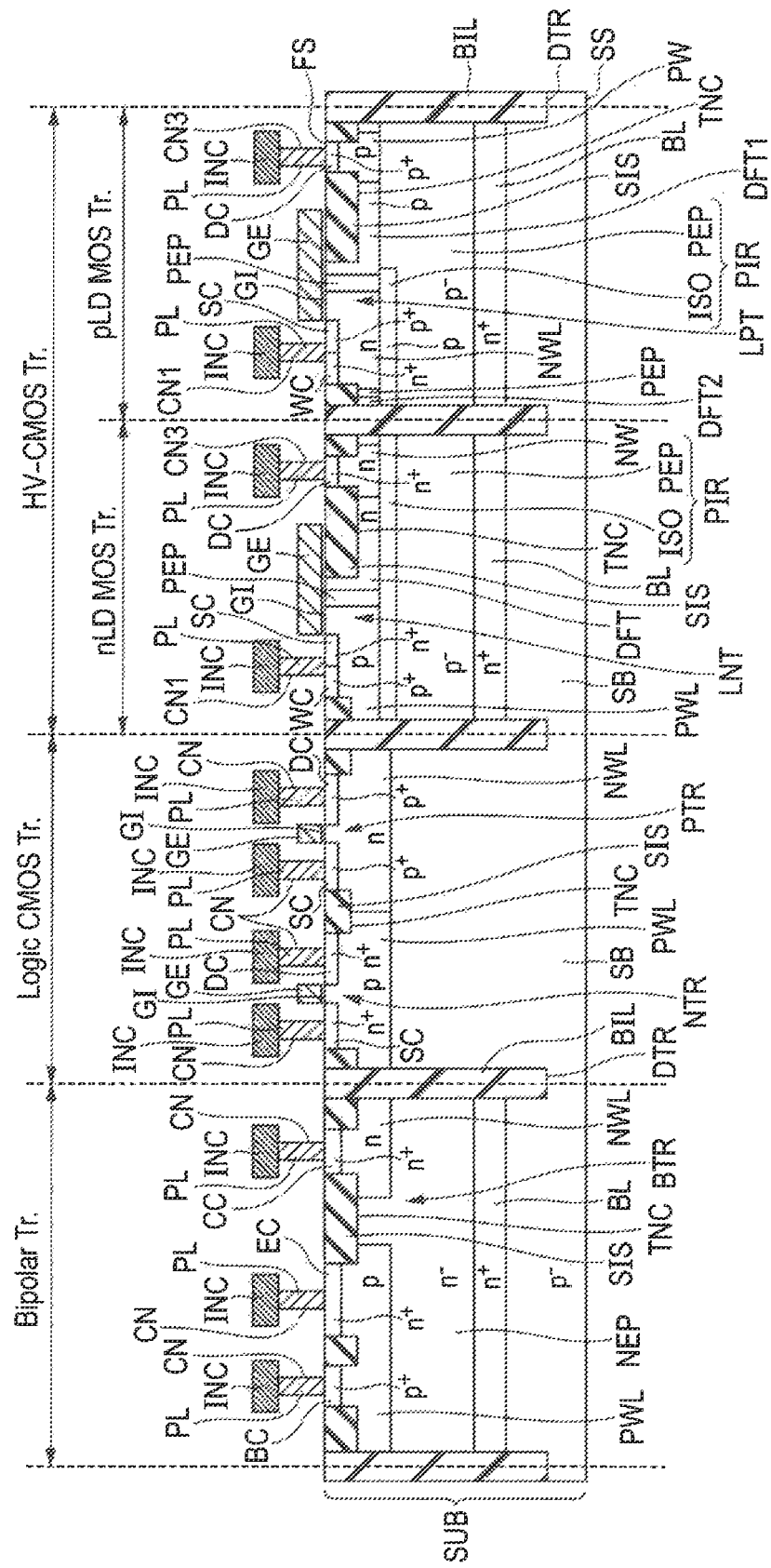
FIG. 2 is a sectional view showing the structure of the semiconductor device shown in FIG. 1.

As shown in FIG. 2, the semiconductor device of the present embodiment includes high-voltage (HV) CMOS transistors LNT, LPT, logic CMOS transistors NTR and PTR and a bipolar transistor BTR.

The high-voltage CMOS transistor includes a p-channel LDMOS transistor LPT (a first insulated-gate field-effect transistor) and an n-channel LDMOS transistor LNT (a second insulated-gate field-effect transistor). The logic CMOS transistor includes an n-channel MOS transistor NTR and a p-channel MOS transistor PTR.

In the following, the n-channel LDMOS transistor will be referred to as an "nLDMOS transistor" and the p-channel LDMOS transistor will be referred to as a "pLDMOS transistor". Also, the n-channel MOS transistor will be referred to as an "nMOS transistor" and the p-channel MOS transistor will be referred to as a "pMOS transistor".

The semiconductor substrate SUB has a first surface FS and a second surface SS which oppose each other. The transistors are formed in the first surface FS of the semiconductor substrate SUB and are mutually electrically isolated by DTI (Deep Trench Isolation). The DTI includes a trench DTR formed in the first surface FS of the semiconductor substrate and insulation film BIL filled in the trench DTR.

The region where the logic CMOS transistor is formed includes a p⁻ substrate region SB provided in the second surface SS side of the semiconductor substrate SUB. On the first surface FS side of the p⁻ substrate region SB, a p-well region PWL and an n-well region NWL are formed side by side. In the p-well region PWL, the nMOS transistor NTR is formed. In the n-well region NWL, the pMOS transistor PTR is formed.

The region where the nMOS transistor NTR is formed and the region where the pMOS transistor PTR is formed are mutually electrically isolated by STI (Shallow Trench Isolation). The STI includes an isolation trench TNC formed in the first surface FS of the semiconductor substrate SUB and isolating insulation film SIS filled in the isolation trench TNC.

The isolation trench TNC of the STI is shallower from the first surface FS than the trench DTR of the DTI. Also, the isolation trench TNC of the STI is shallower than the p-well region PWL and the n-well region NWL.

The nMOS transistor NTR includes an n⁺ source region SC, an n⁺ drain region DC, a gate insulation film GI and a gate electrode GE. The n⁺ source region SC and the n⁺ drain region DC are formed, away from each other, in the first surface FS in the p-well region PWL. The gate electrode GE is formed, between the n⁺ source region SC and the drain region DC, over the first surface FS via the gate insulation film GI.

The pMOS transistor PTR includes a p⁺ source region SC, a p⁺ drain region DC, a gate insulation film GI and a gate electrode GE. The p⁺ source region SC and the p⁺ drain region DC are formed, away from each other, in the first surface FS in the n-well region MIL. The gate electrode GE is formed, between the p+ source region SC and the p+ drain region DC, over the first surface FS via the gate insulation film GI.

The region where the bipolar transistor BTR is formed includes a p− substrate region SB provided in the second surface SS side of the semiconductor substrate SUB. On the first surface FS side of the p− substrate region SB, an n+ buried region BL is located. On the first surface FS side of the n+ buried region BL, an n− epitaxial region NEP is located. On the first surface FS side of the n− epitaxial region NEP, a p-well region PWL and an n-well region NWL are located side by side with a portion of the n− epitaxial region NEP in between.

In the first surface FS in the p-well region PWL, a p+ base region BC and an n+ emitter region EC are formed. In the first surface FS in the n-well region NWL, an n+ collector region CC is formed. The bipolar transistor BTR includes the p+ base region BC, n+ emitter region EC and n+ collector region CC.

STI is provided between the p+ base region BC and the n+ emitter region EC and also between the n+ emitter region EC and the n+ collector region CC. This mutually electrically isolates the p+ base region BC, n+ emitter region EC and n+ collector region CC.

The impurity regions (the n+ source region SC, n+ drain region DC, p+ source region SC, p+ drain region DC, p+ base region BC, n+ emitter region EC and n+ collector region CC) are each electrically coupled with a wiring layer INC.

To be specific, an interlayer insulation film (not shown) is formed over the first surface FS of the semiconductor substrate SUB. The interlayer insulation film has through contact holes CN respectively reaching the impurity regions. The contact holes CN are each filled with a conductive plug layer PL. Over the interlayer insulation film, the wiring layer INC is formed to be in contact with the conductive plug layer PL. Thus, the wiring layer INC is electrically coupled to the impurity regions via the conductive plug layer PL.

Next, the pLDMOS transistor included in the high voltage COMS transistor shown in FIG. 2 will be described with reference to FIGS. 3 to 6. In the following description, a planar view represents a view in a direction perpendicular to the first surface FS of the semiconductor substrate SUB.

Figure 3:
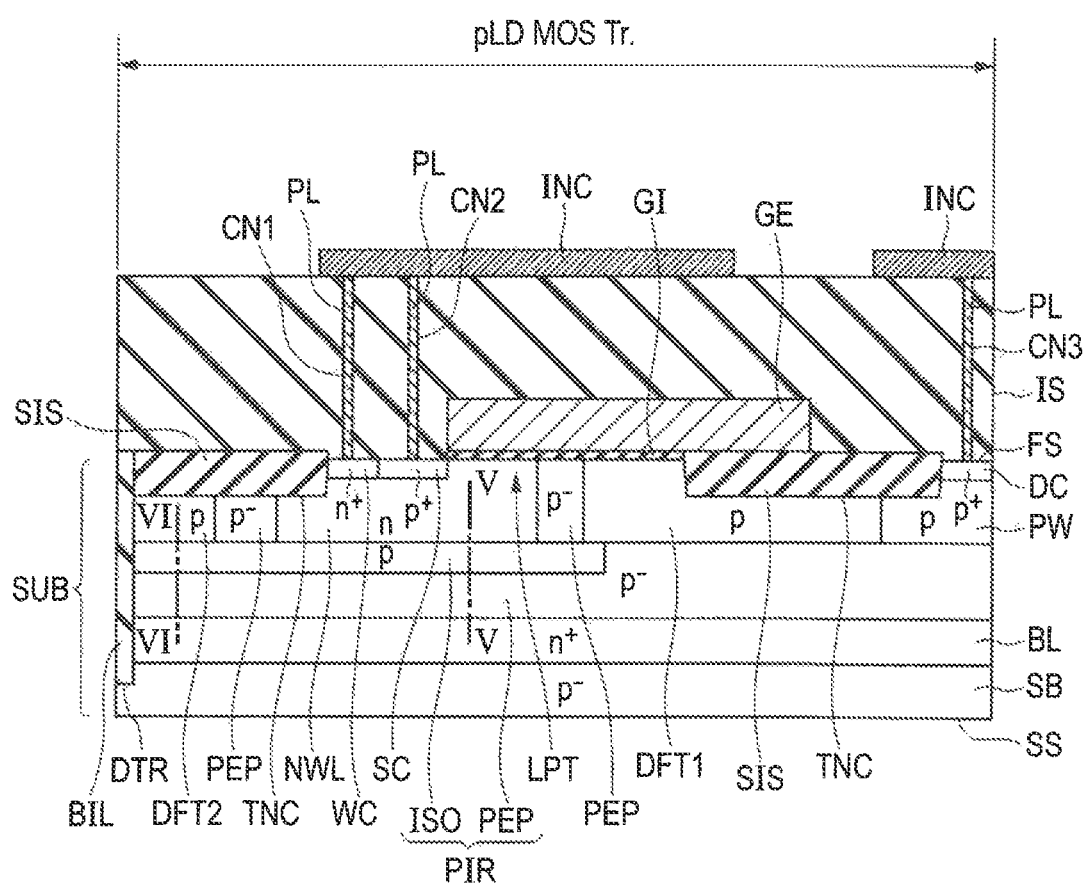
FIG. 3 is a schematic sectional view taken along line III-III in FIG. 4 and shows the structure of the pLDMOS transistor shown in FIG. 2.

As shown in FIG. 3, the region where the pLDMOS transistor LPT is formed includes a p− substrate region SB provided in the second surface SS side of the semiconductor substrate SUB. On the first surface FS side of the p− substrate region SB, an n+ buried region BL (a first buried region) is provided to be away from the second surface SS of the semiconductor substrate SUB. The n+ buried region BL has a floating potential.

The n+ buried region BL forms a p-n junction with a p− substrate region SB. On the first surface FS side of the n+ buried region BL, a p-type impurity region PIR (a first impurity region) is formed. The p-type impurity region PIR forms a p-n junction with the n+ buried region BL.

The p-type impurity region PIR includes a p− epitaxial region PEP (a first epitaxial region) and a p-type punch-through prevention layer (ISO) (a first high-concentration region). The p− epitaxial region PEP forms a p-n junction with the n+ buried region BL. The p-type punch-through prevention layer ISO has a p-type impurity concentration higher than that of the p− epitaxial region PEP. The p-type punch-through prevention layer ISO is located on the first surface FS side of the p− epitaxial region PEP.

On the first surface FS side of the p-type impurity region PIR, mainly regions such as a p-type drift region DFT1 (a drift region), a p-well region PW, an n-type body region NWL (a first body region) and a p-type punch-through prevention layer DFT2 (a second high-concentration region) are located.

The second surface SS side of the p-well region PW is entirely in contact with the p− epitaxial region PEP. The p-well region PW has a p-type impurity concentration higher than that of the p− epitaxial region PEP. In the first surface FS in the p-well region PW, a p+ drain region DC is forced. The p+ drain region DC has a p-type impurity concentration higher than that of the p-well region PW. The p-type drift region DFT1 is located adjacently to the p-well region PW.

A portion of the second surface SS side of the p-type drift region DFT1 is in contact with the p− epitaxial region PEP included in the p-type impurity region PIR. The other portion of the second surface SS side of the p-type drift region DFT1 is in contact with the p-type punch-through prevention layer ISO included in the p-type impurity region PIR. The p-type drift region DFT1 has a p-type impurity concentration higher than that of the p− epitaxial region PEP.

The p-type punch-through prevention layer DFT2 is located adjacently to the side wall of the trench DTR of the DTI to be between the n-type body region NWL and the side wall of the trench DTR. The p-type punch-through prevention layer DFT2 has a p-type impurity concentration higher than that of the p− epitaxial region PEP. The second surface SS side of the p-type punch-through prevention layer DFT2 is entirely in contact with the p-type punch-through prevention layer ISO of the p-type impurity region PIR. A portion of the p− epitaxial region PEP is formed between the p-type punch-through prevention layer DFT2 and the n-type body region NWL.

The n-type body region NWL is formed on the first surface FS side of the n+ buried region BL and forms a p-n junction with the p-type impurity region PIR. To be specific, the whole of the second surface SS side of the n-type body region NWL forms a p-n junction with the p-type punch-through prevention layer ISO of the p-type impurity region PIR. A portion of the p− epitaxial region PEP is formed between the n-type body region NWL and the p-type drift region DFT1. There may be a portion of the p− epitaxial region PEP formed between the n-type body region NWL and the p-type punch-through prevention layer ISO.

A p+ source region SC and an n+ contact region WC are formed in the first surface FS in the n-type body region NWL. The p+ source region SC and the n+ contact region WC are adjacent to each other. The p+ source region SC forms a p-n junction with each of the n-well region NWL and the n+ contact region WC. The p+ source region SC is formed in the first surface FS to be away from the p+ drain region DC. The n+ contact region WC has an n-type impurity concentration higher than that of the n-well region NWL.

An isolation trench TNC of the STI is formed between the p+ source region SC and the p+ drain region DC. The p+ drain region DC is adjacent to the isolation trench TNC. The p-type drift region DFT1 and the p− epitaxial region PEP are formed in the first surface FS between the p+ source region SC and the isolation trench TNC.

A gate electrode GE is formed over the first surface FS, via the gate insulation film GI, between the p+ source region SC and the p-type drift region DFT1. Namely, the gate electrode GE opposes the first surface FS between the p+ source region SC and the p-type drift region DFT1 while being insulated from the first surface FS.

The gate electrode GE is formed to be partly over the isolating insulation film SIS of the STI and to oppose the p-type drift region DFT1 via the isolating insulation film SIS of the STI.

An interlayer insulation film IS is formed over the first surface FS of the semiconductor substrate SUB and covers the pLDMOS transistor LPT. The interlayer insulation film IS has through contact holes CN1, CN2 and CN3 reaching the n⁺ contact region WC, p⁺ source region SC and p⁺ drain region DC, respectively. The contact holes CN1, CN2 and CN3 are each filled with a conductive plug layer PL. Over the interlayer insulation film IS, a wiring layer INC is formed to be in contact with the conductive plug layers PL. Thus, the wiring layer INC is electrically coupled to the impurity regions via the conductive plug layers PL.

As described above, the p-type punch-through prevention layer ISO is formed, for example, to extend from the side wall of the trench DTR of the DTI to the p-type drift region DFT1. Thus, the p-type punch-through prevention layer ISO is in contact with the entire second surface side of the p-type punch-through prevention layer DFT2 and also of the n-type body region NWL that are formed between the trench DTR of the DTI and the p-type drift region. DFT1. The p-type punch-through prevention layer ISO is also in contact with the side wall of the trench DTR of the DTI.

Also, the p-type impurity region PIR is located between the n⁺ buried region BL and the n-type body region NWL and isolates the n⁺ buried region BL and the n-type body region NWL from each other.

Figure 4:
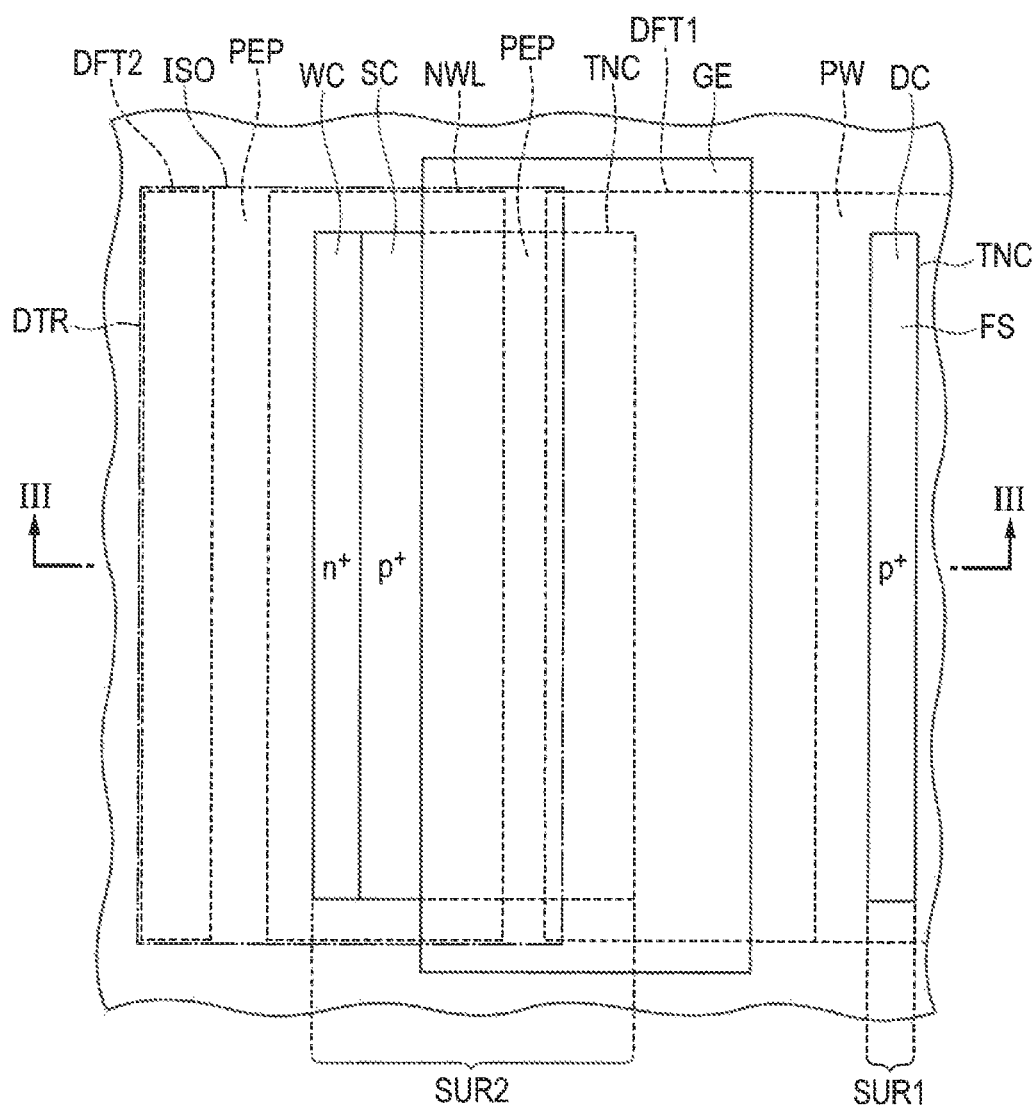
FIG. 4 is a plan view showing the region where the pLDMOS transistor shown in FIG. 2 is formed.

FIG. 4 is a plan view of the region where the pLDMOS transistor shown in FIG. 2 is formed. As shown in FIG. 4, in planar view, the isolation trench TNC is formed in the first surface FS of the semiconductor substrate SUB. Of the first surface FS, a surface region SUR1 surrounded by the isolation trench TNC includes the p⁺ drain region DC of the pLDMOS transistor LPT. Also, of the first surface FS, another surface region SUR2 surrounded by the isolation trench TNC includes the p-type drift region DFT1, p⁻ epitaxial region PEP, n-type body region NWL, p⁺ source region SC and n⁺ contact region WC.

In planar view, a portion of the p⁻ epitaxial region PEP is formed between the n-type body region NWL and the p-type punch-through prevention layer DFT2. Also, in planar view, a portion of the p⁻ epitaxial region PEP is formed between the n-type body region NWL and the p-type drift region DFT1. In planar view, the p-well region PW is formed adjacently to the p-type drift region DFT1.

In planar view, the whole of the p⁺ source region SC and also of the n⁺ contact region WC overlaps with the n-type body region NWL. Also, in planar view, the p-type punch-through prevention layer ISO extends from the side wall of the trench DTR, shown in a leftmost part of the pLDMOS transistor region in FIG. 2, of the DTI to the p-type drift region DFT1. Thus, the p-type punch-through prevention layer ISO overlaps, in planar view, with the whole of the n-type body region NWL and the whole of the p-type punch-through prevention layer DFT2. The p-type punch-through prevention layer ISO also overlaps, in planar view, with the whole of the p⁺ source region SC and the whole of the n⁺ contact region WC. The whole of the p⁺ drain region DC overlaps, in planar view, with the p-well region PW.

Next, with reference to FIGS. 5 and 6, the impurity concentration distributions in the depth direction (direction from the first surface FS toward the second surface SS) of the p-type impurity region PIR and the p-type punch-through prevention layer DFT2 will be described.

Figure 5:
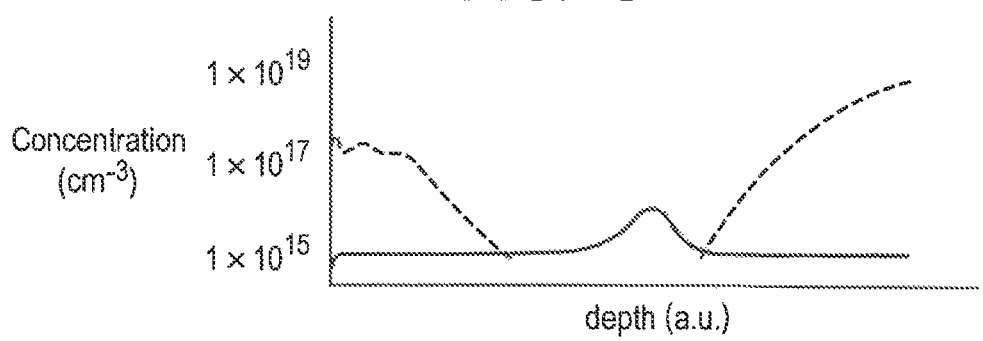
FIG. 5 is a graph showing the distribution of impurity concentrations in portions along line V-V in FIG. 4.
Figure 6:
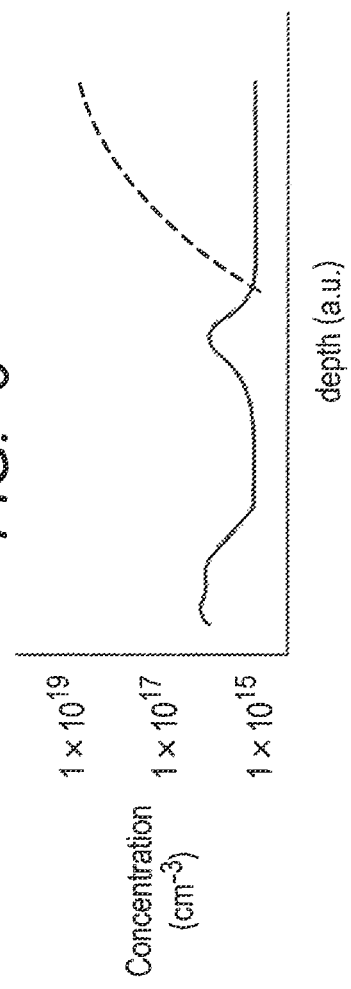
FIG. 6 is a graph showing the distribution of impurity concentrations in portions along line VI-VI in FIG. 4.

FIGS. 5 and 6 respectively represent the impurity concentration distributions along lines V-V and VI-VI shown in FIG. 4. As shown in FIG. 5, the p-type impurity concentration in the p⁻ epitaxial region PEP included in the p-type impurity region PIR is, for example, about $1 \times 10^{15}$ cm$^{-3}$. The p-type punch-through prevention layer ISO included in the p-type impurity region PIR has a peak p-type impurity concentration of, for example, about $1 \times 10^{16}$ cm$^{-3}$ to be higher than the p-type impurity concentration in the p⁻ epitaxial region PEP.

As shown in FIG. 6, the p-type punch-through prevention layer DFT2 has a p-type impurity concentration of, for example, about $1 \times 10^{16}$ cm$^{-3}$ to be higher than the p-type impurity concentration in the p⁻ epitaxial region PEP.

Next, the nLDMOS transistor included in the high-voltage CMOS transistor shown in FIG. 2 will be described.

As shown in FIG. 2, in the region where the nLDMOS transistor LNT is formed, a p⁻ substrate region SB is formed in the second surface SS side of the semiconductor substrate SUB. On the first surface FS side of the p⁻ substrate region SB, an n⁺ buried region BL (a second buried region) is formed. The n⁺ buried region BL is formed away from the second surface SS and has a floating potential.

The n⁺ buried region BL forms a p-n junction with the p⁻ substrate region SB. On the first surface FS side of the n⁺ buried region BL, a p-type impurity region PIR (a second impurity region) is formed. The p-type impurity region PIR forms a p-n junction with the n⁺ buried region BL.

The p-type impurity region PIR includes a p⁻ epitaxial region PEP (a second epitaxial region) and a p-type punch-through prevention layer (ISO) (a third high-concentration region). The p⁻ epitaxial region PEP forms a p-n junction with the n⁺ buried region BL. The p-type punch-through prevention layer ISO has a p-type impurity concentration higher than that of the p⁻ epitaxial region PEP. The p-type punch-through prevention layer ISO is formed on the first surface FS side of the p⁻ epitaxial region PEP.

The p-type punch-through prevention layer ISO is formed in an impurity injection process in which the p-type punch-through prevention layer ISO of the pLDMOS transistor LET is also formed. Therefore, the p-type punch-through prevention layer ISO of the nLDMOS transistor LNT and the p-type punch-through prevention layer ISO of the pLDMOS transistor LPT are approximately the same in p-type impurity concentration distribution and in the depth where the p-type impurity concentration peaks.

On the first surface FS side of the p-type impurity region PIR, regions such as an n-type drift region DFT, an n-well region NW and a p-type body region PWL (a second region) are located. The whole of the second surface SS side of each of the n-type drift region DFT, the n-well region NW and the p-type body region PWL is in contact with the p-type punch-through prevention layer ISO. The p-type punch-through prevention layer ISO overlaps, in planar view, with the whole of the region where the nLDMOS transistor LNT is formed. Namely, in planar view, the p-type punch-through prevention layer ISO is in contact with the side wall, along the entire periphery thereof, of the trench DTR of the DTI that surrounds the region where the nLDMOS transistor LNT is formed.

In the first surface FS, an n⁺ drain region DC is formed being surrounded by the n-well region NW. The n⁺ drain region DC has an n-type impurity concentration higher than that of the n-well region NW. The n-type drift region DFT is formed adjacently to the n-well region NW.

The p-type body region PWL is located on the first surface FS side of the n⁺ buried region BL. A portion of the p⁻ epitaxial region PEP is formed between the p-type body region PWL and the n-type drift region DFT. The p-type impurity region PIR is located between the n⁺ buried region BL and the n-well region NW and the n-type drift region DFT and isolates the two regions from each other.

In the first surface FS in the p-type body region PWL, an n+ source region SC and a p+ contact region WC are formed adjacently to each other. The n+ source region SC forms a p-n junction with each of the p-well region PWL and the p+ contact region. WC. The n+ source region SC is formed in the first surface FS to be away from the n+ drain region DC. The p+ contact region WC has a p-type impurity concentration higher than that of the p-well region PWL.

An isolation trench TNC of the STI is formed between the n+ source region SC and the n+ drain region DC. The n+ drain region DC is adjacent to the isolation trench TNC. The p-well region PWL, the p− epitaxial region PEP and the n-type drift region DFT are formed in the first surface FS between the n+ source region SC and the isolation trench TNC.

A gate electrode GE is formed over the first surface FS via the gate insulation film GI to be between the n+ source region SC and the n-type drift region DFT. Namely, the gate electrode GE opposes the first surface FS between the n+ source region SC and the n-type drift region DFT while being insulated from the first surface FS.

The gate electrode GE is formed to be partly over the isolating insulation film SIS of the STI and to oppose the n-type drift region DFT via the isolating insulation film SIS of the STI.

An interlayer insulation film IS is formed over the first surface FS of the semiconductor substrate SUB and covers the nLDMOS transistor LNT. The interlayer insulation film IS has through contact holes CN1, CN2 and CN3 reaching the p+ contact region WC, n+ source region SC and n+ drain region DC, respectively. The contact holes CN1, CN2 and CN3 are each filled with a conductive plug layer PL. Over the interlayer insulation film IS, a wiring layer INC is formed to be in contact with the conductive plug layer PL. Thus, the wiring layer INC is electrically coupled to the impurity regions via the conductive plug layers PL.

Next, the semiconductor manufacturing method according to the present embodiment will be described with reference to FIGS. 7 to 13 representing sectional views corresponding to FIG. 3.

Figure 7:
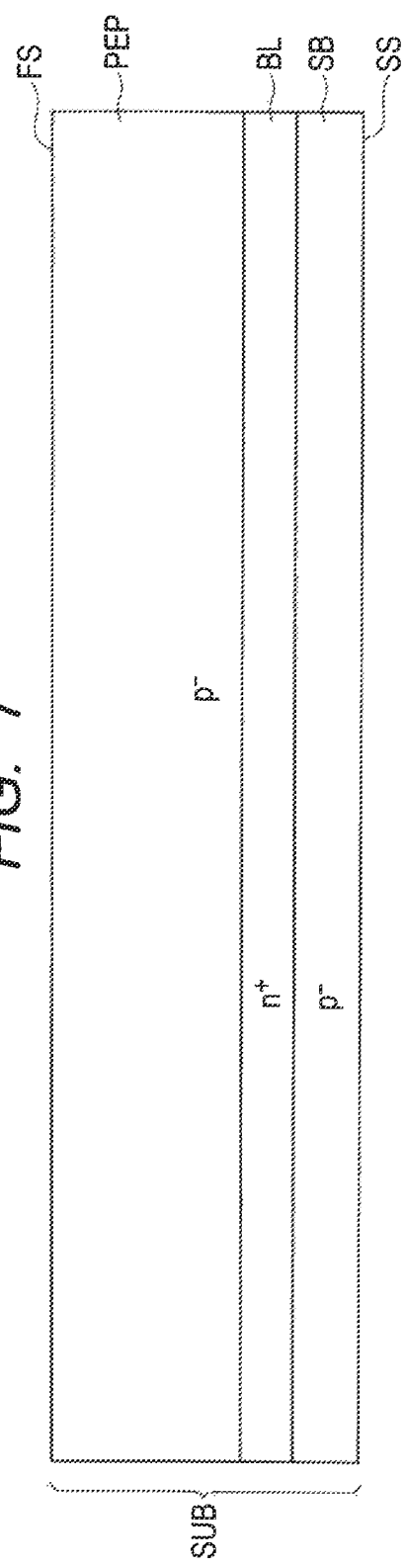
FIG. 7 is a schematic sectional view showing a first step of a semiconductor device manufacturing method according to the first embodiment of the present invention.

As shown in FIG. 7, in the region where the pLDMOS transistor LPT is formed, the n+ buried region BL is formed on the first surface FS side of the p− substrate region SB. The n+ buried region BL is formed to have a floating potential. The p− epitaxial region PEP is formed on the first surface FS side of the n+ buried region BL. The p− epitaxial region PEP is formed to form a p-n junction with the n+ buried region BL.

Figure 8:
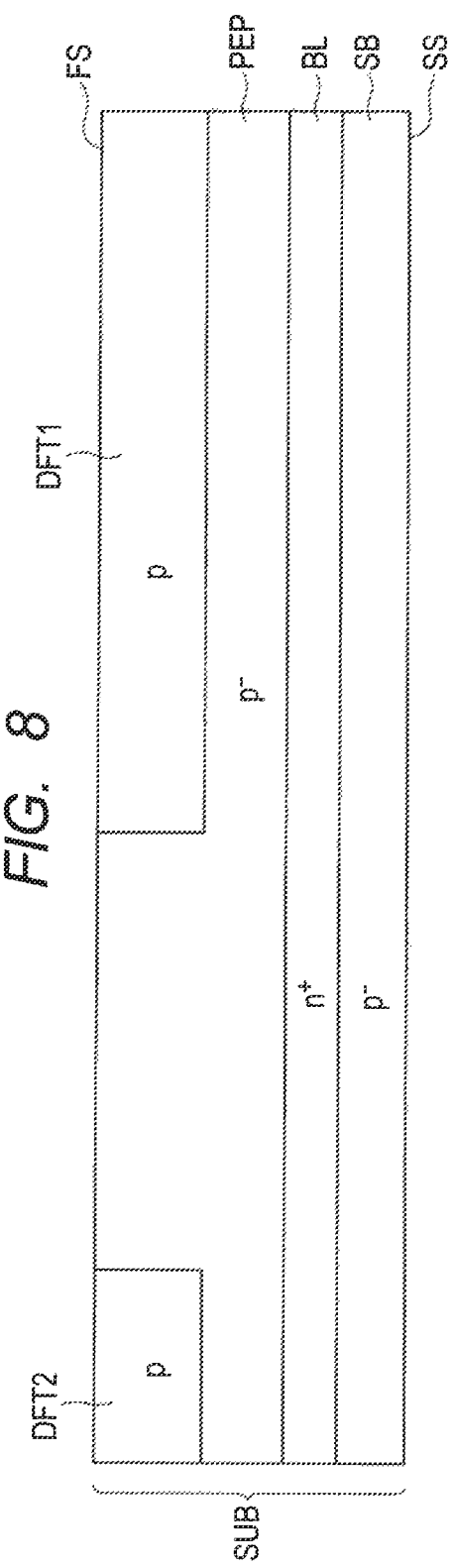
FIG. 8 is a schematic sectional view showing a second step of the semiconductor device manufacturing method according to the first embodiment of the present invention.

As shown in FIG. 8, a first photoresist pattern (not shown) is formed over the first surface FS of the semiconductor substrate SUB using an ordinary photoengraving technique. Using the first photoresist pattern as a mask, p-type impurities are ion-injected into the first surface FS of the semiconductor substrate SUB and, thereby, the p-type drift region DFT1 and the p-type punch-through prevention layer DFT2 are formed in the first surface FS in the p− epitaxial layer. The p-type drift region DFT1 and the p-type punch-through prevention layer DFT2 are each formed to have a p-type impurity concentration higher than that of the p− epitaxial region PIP. Afterward, the first photoresist pattern is removed, for example, by ashing.

Figure 9:
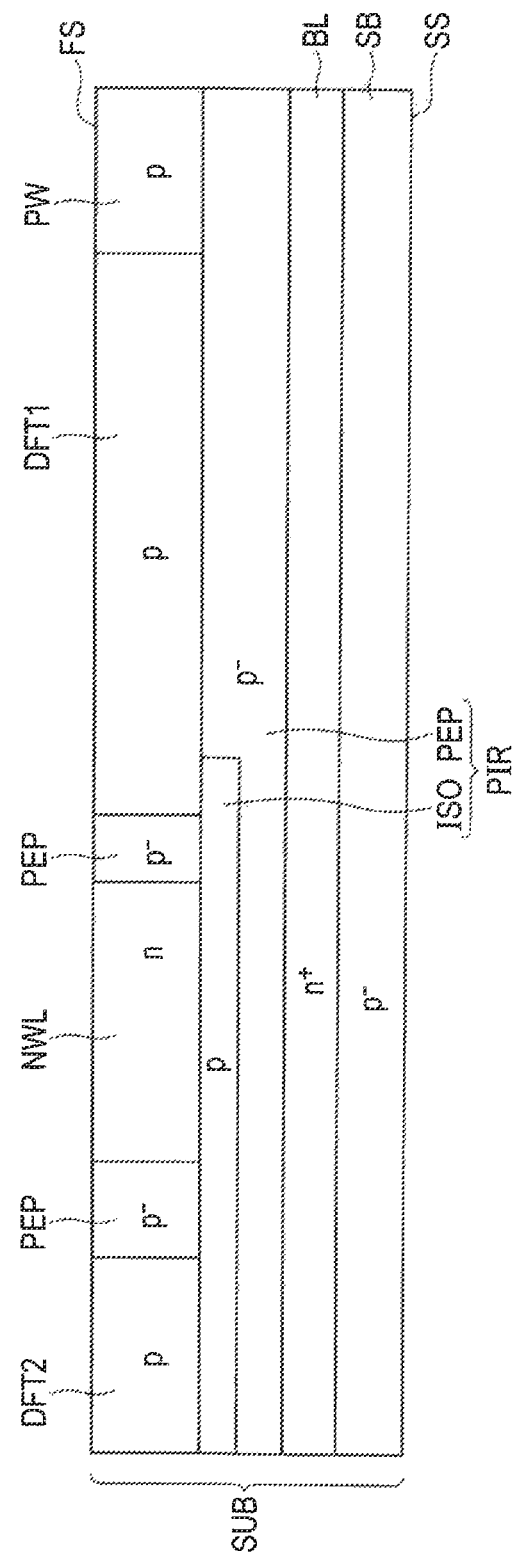
FIG. 9 is a schematic sectional view showing a third step of the semiconductor device manufacturing method according to the first embodiment of the present invention.

As shown in FIG. 9, a second photoresist pattern (not shown) is formed over the first surface FS of the semiconductor substrate SUB using an ordinary photoengraving technique. Using the second photoresist pattern as a mask, n-type impurities are ion-injected into the first surface FS of the semiconductor substrate SUB and, thereby, the n-type body region NWL is formed on the first surface FS side of the n+ buried region BL. The n-type body region NWL is formed in the first surface FS between the p-type drift region DFT1 and the p-type punch-through prevention layer DFT2.

A p− epitaxial region PEP may be formed between the n-type body region NWL and the p-type drift region DFT1 and also between the n-type body region NWL and the p-type punch-through prevention layer DFT2. Afterward, the second photoresist pattern is removed, for example, by ashing.

Subsequently, a third photoresist pattern (not shown) is formed over the first surface FS of the semiconductor substrate SUB using an ordinary photoengraving technique. Using the third photoresist pattern as a mask, p-type impurities are ion-injected into the semiconductor substrate SUB and, thereby, the p-type punch-through prevention layer ISO is formed in the p− epitaxial region PEP. The p-type punch-through prevention layer ISO is formed to have a p-type impurity concentration higher than that of the p− epitaxial region PEP and to be on the first surface FS side of the p− epitaxial region PEP.

The p-type punch-through prevention layer ISO and the p− epitaxial region PEP form the p-type impurity region PIR. The p-type impurity region PIR is located between the n+ buried region BL and the n-type body region NWL and isolates the two regions from each other. The p-type drift region DFT1 is located on the first surface FS side of the p-type impurity region PIR.

The p-type punch-through prevention layer ISO is formed on the second surface SS side of the p-type drift region DFT1, the n-type body region NWL and the p-type punch-through prevention layer DFT2. The p-type punch-through prevention layer ISO is formed to be in contact with the whole of the second surface SS sides of the p-type drift region DFT2 and n-type body region NWL and with a portion of the second surface SS side of the p-type drift region DFT1.

The p− epitaxial region PEP may be formed between the p-type punch-through prevention layer ISO and the n-type body region NWL. Also, the p-type punch-through prevention layer ISO in the region where the pLDMOS transistor LPT is formed is formed in an impurity injection process in which the p-type punch-through prevention layer ISO in the region where the nLDMOS transistor LNT is formed as shown in FIG. 2 is also formed. Afterward, the third photoresist pattern is removed, for example, by ashing.

Figure 10:
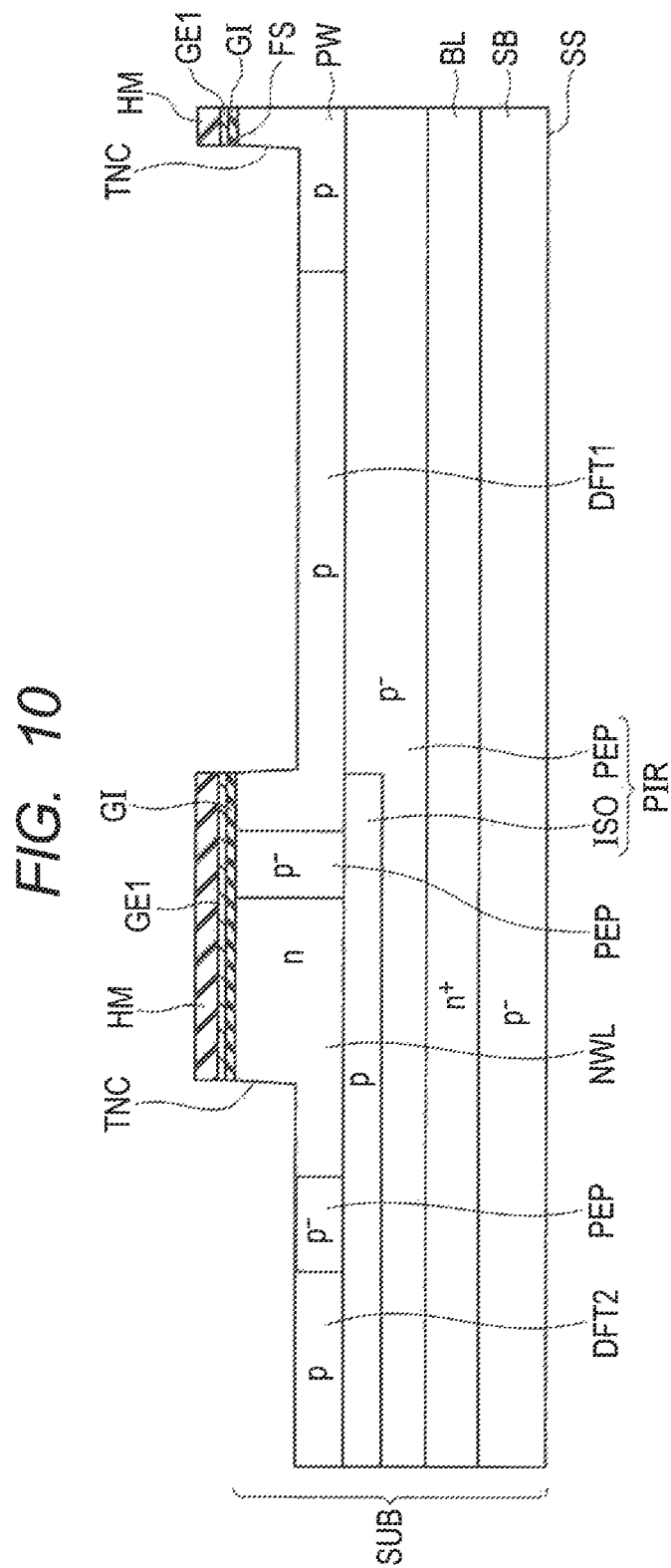
FIG. 10 is a schematic sectional view showing a fourth step of the semiconductor device manufacturing method according to the first embodiment of the present invention.

As shown in FIG. 10, the gate insulation film GI of, for example, silicon oxide, is formed over the first surface FS of the semiconductor substrate SUB. The gate insulation film GI ranges, for example, from several μm to tens of μm in thickness. Over the gate insulation film GI, a conductive film GE1, for example, a doped polysilicon film is formed. Over the conductive film GE1, a hard mask layer HM of, for example, silicon nitride film is formed. The conductive film GE1 and the hard mask layer HM each have a thickness of, for example, tens of nm.

Subsequently, the hard mask layer HM is patterned using an ordinary photoengraving technique and an ordinary etching technique. Using the patterned hard mask layer HM as a mask, the conductive film GE1, the gate insulation film GI and the semiconductor substrate SUB are etched. Through the etching, the isolation trench TNC of the STI is formed in the first surface FS of the semiconductor substrate SUB. The isolation trench TNC is formed to be shallower than the n-type body region NWL, p-type drift region DFT1 and p-type punch-through prevention layer DFT2.

Figure 11:
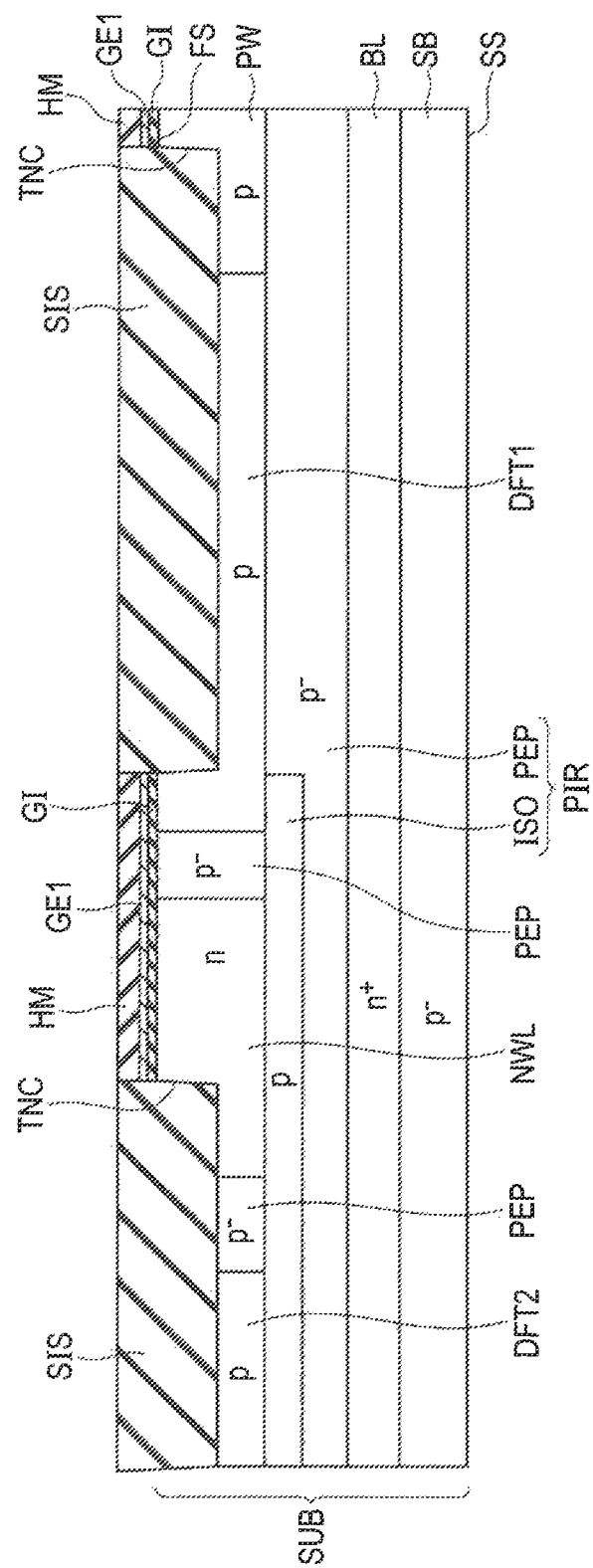
FIG. 11 is a schematic sectional view showing a fifth step of the semiconductor device manufacturing method according to the first embodiment of the present invention.

As shown in FIG. 11, the isolating insulation film SIS of, for example, silicon oxide is formed in the manner of filling the isolation trench TNC. For example, the isolating insulation film SIS is formed all over the first surface FS of the semiconductor substrate SUB, thereby, completely filling the isolation trench TNC and, subsequently, the isolating insulation film SIS is polished away, for example, by a CMP (Chemical Mechanical Polishing) method until the surface of the hard mask layer HM is exposed. This leaves the isolating insulation film SIS only inside the isolation trench TNC. In this way, the STI including the isolation trench TNC and the isolating insulation film SIS is formed. Afterward, the hard mask layer HM is removed, for example, by etching.

Figure 12:
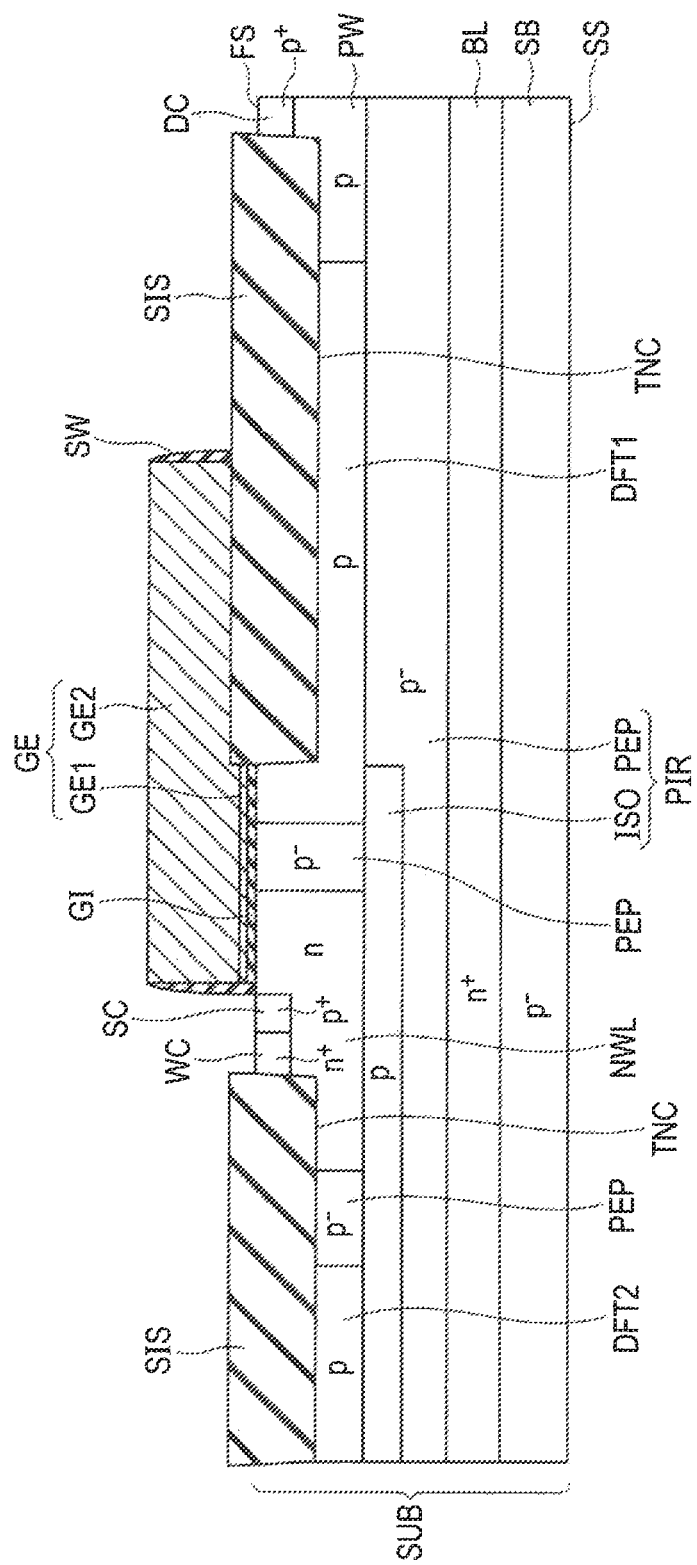
FIG. 12 is a schematic sectional view showing a sixth step of the semiconductor device manufacturing method according to the first embodiment of the present invention.

As shown in FIG. 12, a conductive film GE2 of, for example, doped polysilicon is formed all over the first surface FS of the semiconductor substrate SUB. The conductive film GE2 is formed to have a thickness of, for example, tens of nm. Subsequently, the conductive films GE2 and GE1 are patterned using an ordinary photoengraving technique and an ordinary etching technique. In this way, the gate electrode GE including the conductive films GE2 and GE1 is formed.

A side-wall insulation layer SW shaped like a side wall is formed over the side wall of the gate electrode GE. Subsequently, n-type impurities and p-type impurities are injected into the first surface FS of the semiconductor substrate SUB, for example, by ion injection to form the $p^+$ source region SC, the $p^+$ drain region DC and the $n^+$ contact region WC in the first surface FS of the semiconductor substrate SUB. The $p^+$ source region SC is formed to form a p-n junction with the n-type body region NWL. The $p^+$ drain region DC is formed to be away from the $p^+$ source region SC.

Figure 13:
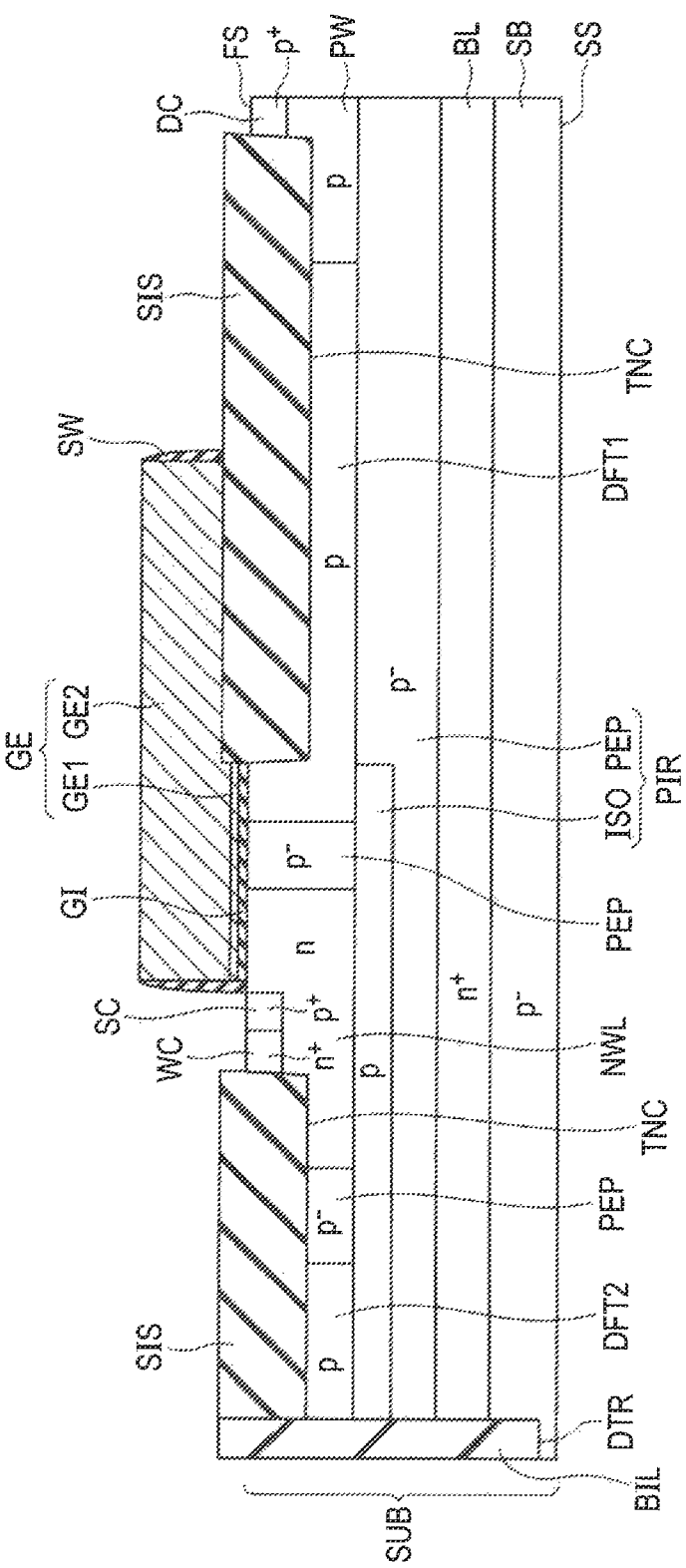
FIG. 13 is a schematic sectional view showing a seventh step of the semiconductor device manufacturing method according to the first embodiment of the present invention.

As shown in FIG. 13, the trench DTR is formed to reach, from the upper surface of the isolating insulation film SIS, the $p^-$ substrate region SB in the direction from the first surface FS toward the second surface SS. The insulation film BIL, for example, a silicon oxide film is formed in the manner of filling the trench DTR. In this way, the DTI including the trench DTR and the insulation film BIL is formed.

The trench DTR is formed such that the p-type punch-through prevention layer DFT2 is located between the n-type body region NWL and the trench DTR.

As shown in FIGS. 2 and 3, the semiconductor device of the present embodiment is produced by forming, for example, the interlayer insulation film IS, conductive plug layer PL and wiring layer INC.

Next, the operation and effects of the present embodiment will be described along with the study made by the present inventors.

Figure 14:
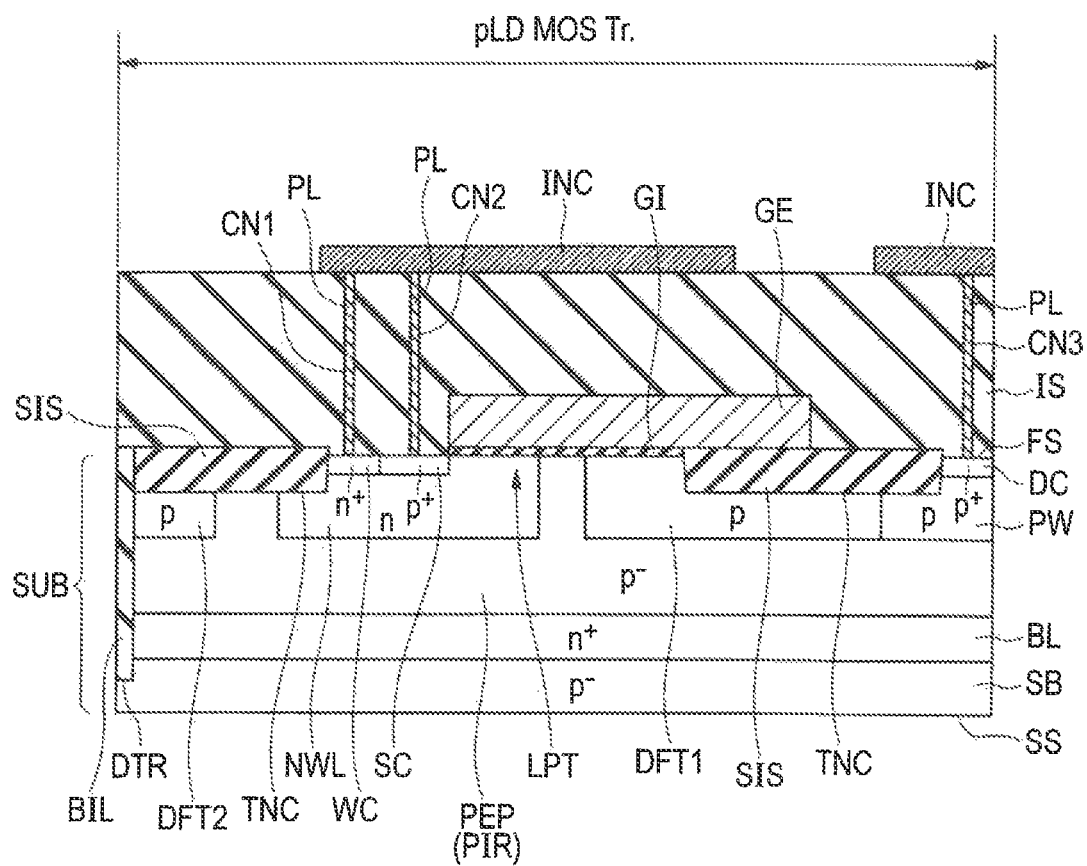
FIG. 14 is a sectional view showing the structure according to the first embodiment of the present invention less the p-type punch-through prevention layer ISO.
Figure 15A:
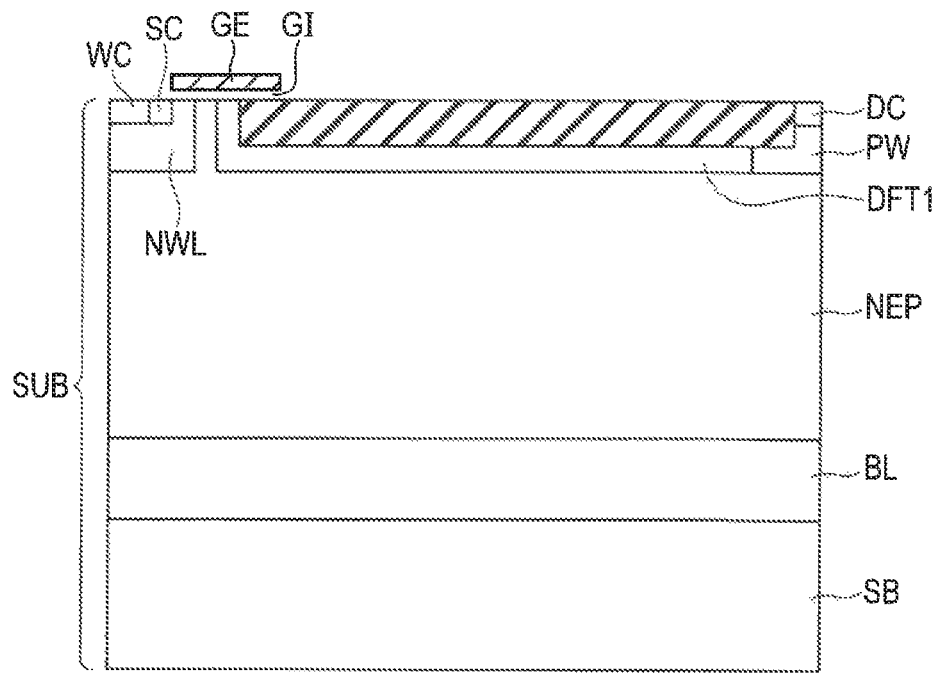
FIG. 15A is a sectional view showing an example structure for comparison.

The present inventors initially measured the potential distributions in the structures shown in FIGS. 3, 14 and 15(A), respectively. The potential distributions in the structures shown in FIGS. 3, 14 and 15(A) known by conducting the measurement are shown in FIGS. 16, 17 and 15(B), respectively.

The structure shown in FIG. 14 is the same as the structure shown in FIG. 3 less the p-type punch-through prevention layer ISO. In the structure shown in FIG. 15A, the $n^-$ epitaxial region NEP is formed between the $n^+$ buried region BL and the n-type body region NWL. In the structure shown in FIG. 15A, the n-type body region NWL and the $n^+$ buried region BL are electrically coupled to each other via the $n^+$ epitaxial region NEP.

Figure 15B:
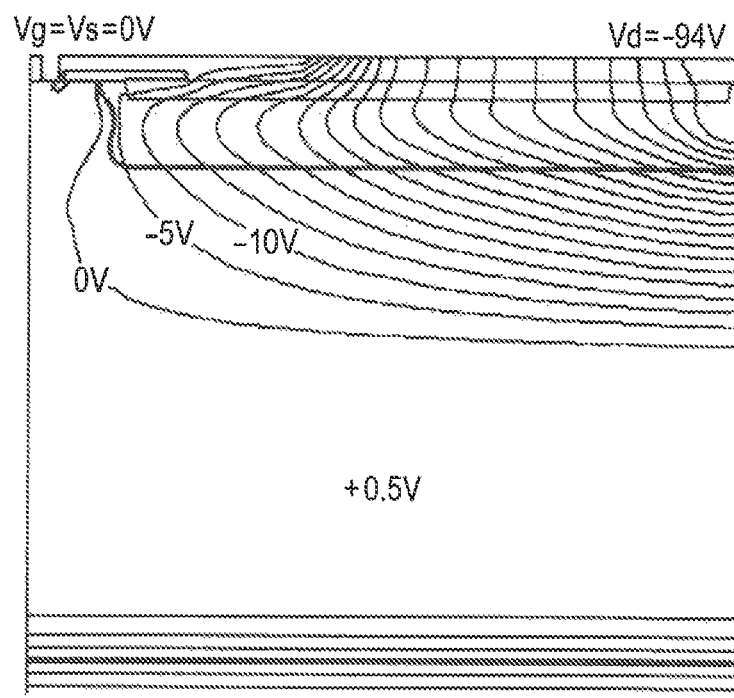
FIG. 15B is a contour plot of a potential distribution in the example structure shown in FIG. 15A.

It has been found that, when the n-type body region NWL and the $n^+$ buried region BL are electrically coupled as shown in FIG. 15A, the potentials of the n-type body region NWL and the $n^+$ buried region BL become approximately equal as shown in FIG. 15B.

Figure 16:
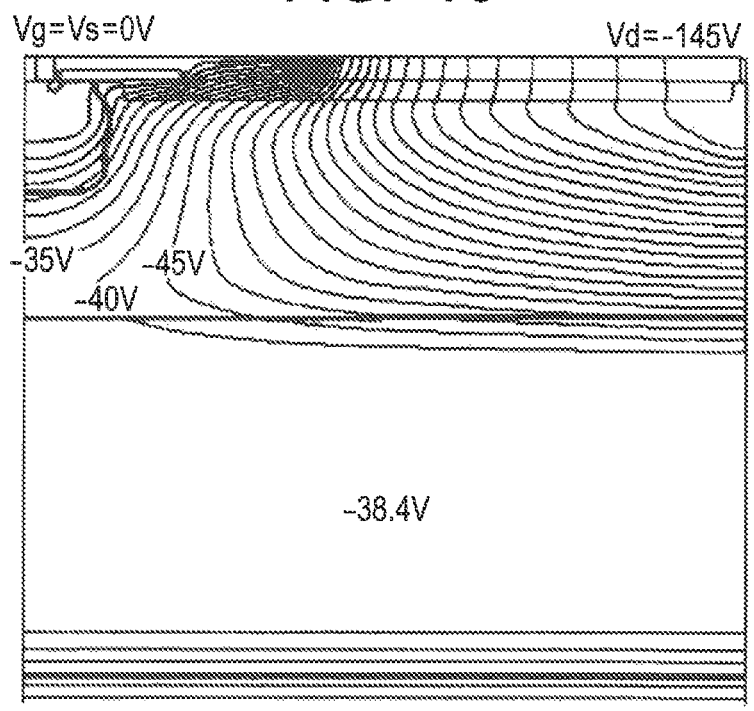
FIG. 16 is a contour plot of a potential distribution in the structure according to the first embodiment of the present invention.
Figure 17:
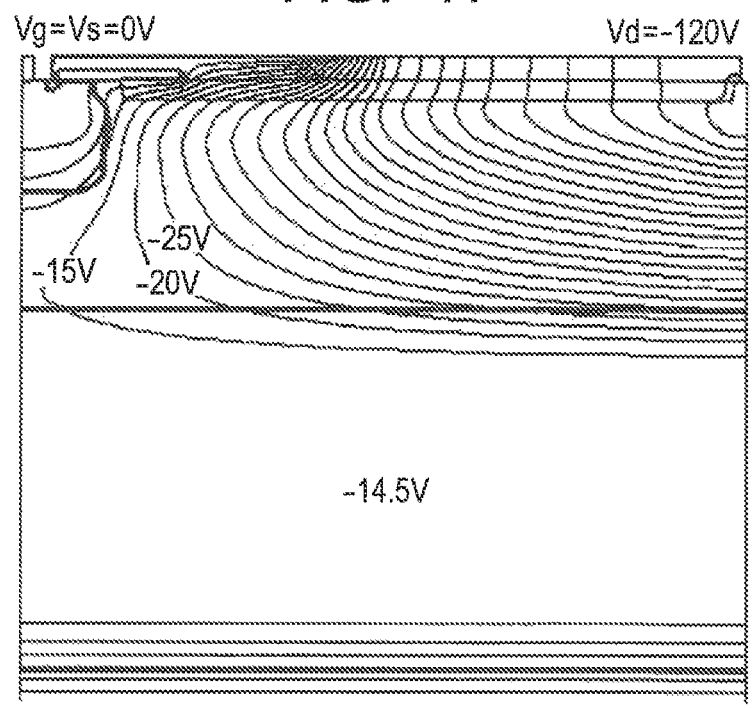
FIG. 17 is a contour plot of a potential distribution in the structure shown in FIG. 14.

It has also been found that, where the n-type body region NWL and the $n^+$ buried region BL are electrically isolated from each other by the p-type impurity region PIR as shown in FIG. 3, a large potential difference can be secured between the n-type body region NWL and the $n^+$ buried region BL as shown in FIG. 16.

It has also been found that, when, as shown in FIG. 14, the p-type punch-through prevention layer ISO is removed from the structure shown in FIG. 3, the potential difference between the n-type body region NWL and the $n^+$ buried region BL becomes, as shown in FIG. 17, larger than shown in FIG. 15B and smaller than shown in FIG. 16.

Figure 18:
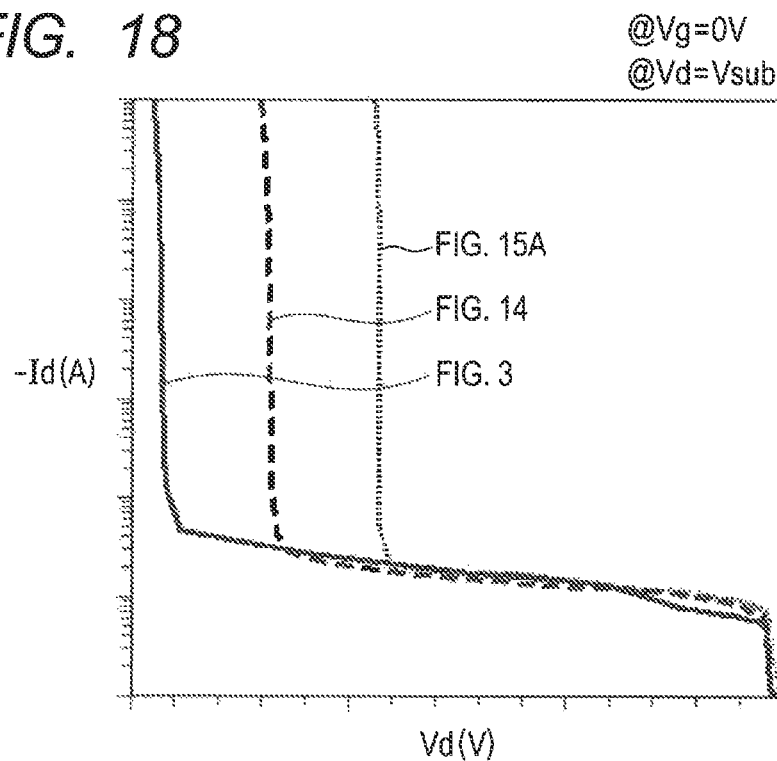
FIG. 18 is a diagram showing Id-Vd waveforms of three structures each in an off state, i.e. the structure according to the first embodiment of the present invention, the structure shown in FIG. 14 and the structure shown in FIG. 15A (example structure for comparison).

The present inventors also measured Id-Vd waveforms in off states of the structures shown in FIGS. 3, 14 and 15(A), respectively, and the results are shown in FIG. 18.

The results shown in FIG. 18 indicate that the breakdown voltage of the structure shown in FIG. 14 is higher than that of the structure shown in FIG. 15A and that the breakdown voltage of the structure shown in FIG. 3 is even higher than that of the structure shown in FIG. 14.

The reason why the breakdown voltages of the structures shown in FIGS. 3 and 14 are higher than that of the structure shown in FIG. 15A is considered to be that, in the structures shown in FIGS. 3 and 14, the n-type body region NWL and the $n^+$ buried region BL are electrically isolated from each other by the p-type impurity region PIR. Also, the reason why the breakdown voltage of the structure shown in FIG. 3 is higher than that of the structure shown in FIG. 14 is considered to be that, in the structure shown in FIG. 3, the effect of the electrical isolation between the n-type body region NWL and the $n^+$ buried region BL is enhanced by the p-type punch-through prevention layer ISO.

Figure 19:
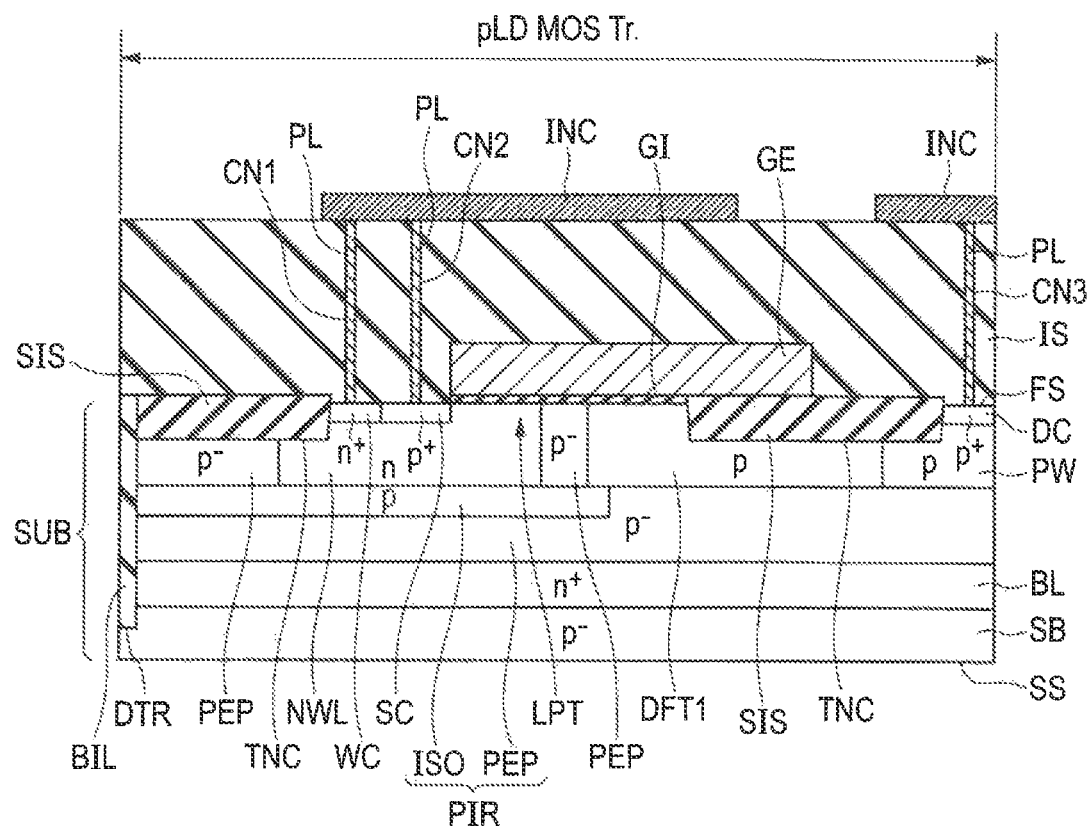
FIG. 19 is a sectional view showing the structure according to the first embodiment of the present invention less the p-type punch-through prevention layer DFT2.
Figure 20:
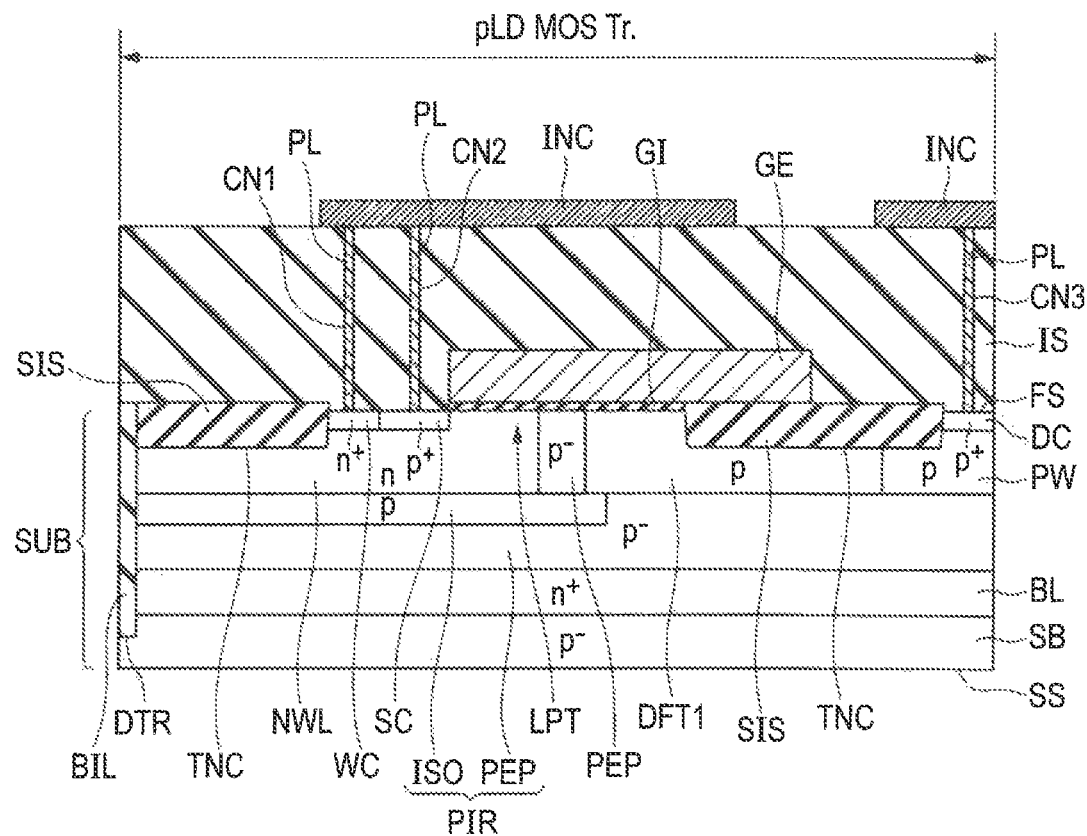
FIG. 20 is a sectional view of the structure according to the first embodiment of the present invention with the n-type body region NWL touching the side wall of the trench DTR of the DTI.
Figure 21:
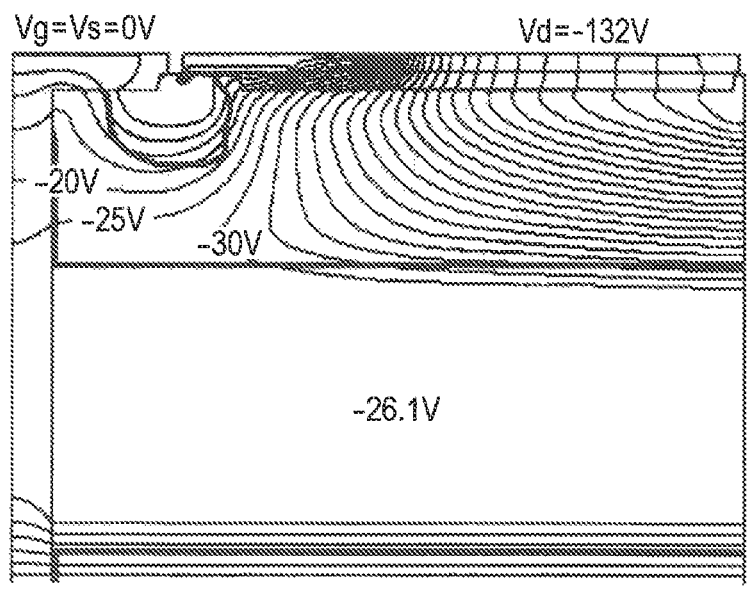
FIG. 21 is a contour plot of a potential distribution in the structure according to the first embodiment of the present invention.
Figure 22:
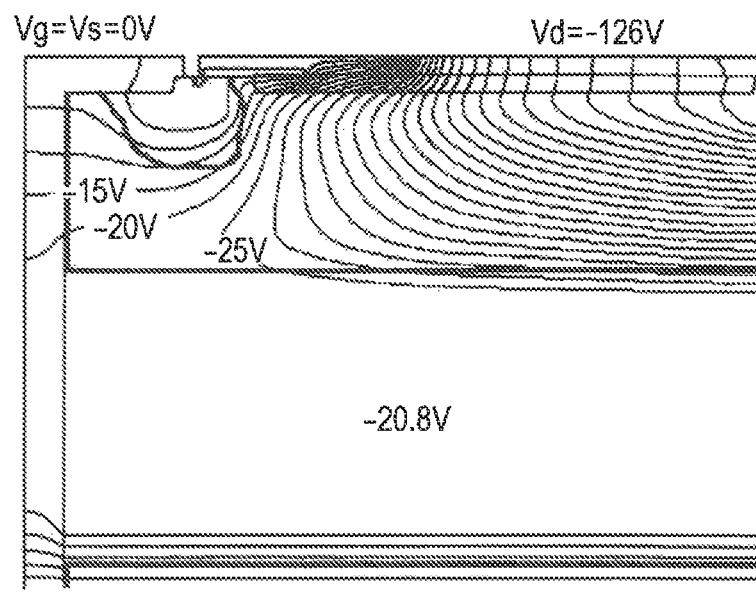
FIG. 22 is a contour plot of a potential distribution in the structure shown in FIG. 19.
Figure 23:
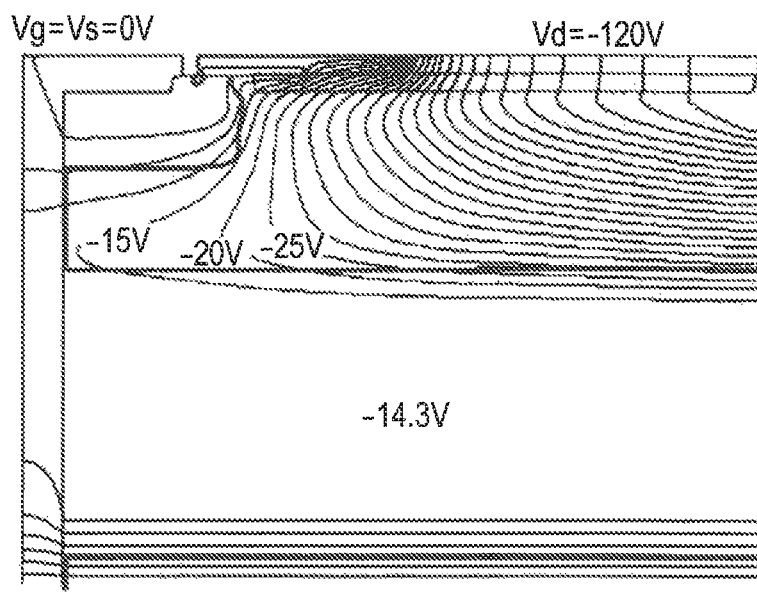
FIG. 23 is a contour plot of a potential distribution in the structure shown in FIG. 20.

The present inventors also measured the potential distributions in the structures shown in FIGS. 3, 19 and 20, respectively. The potential distributions in the structures shown in FIGS. 3, 19 and 20 known by conducting the measurement are shown in FIGS. 21, 22 and 23, respectively.

Figure 24:
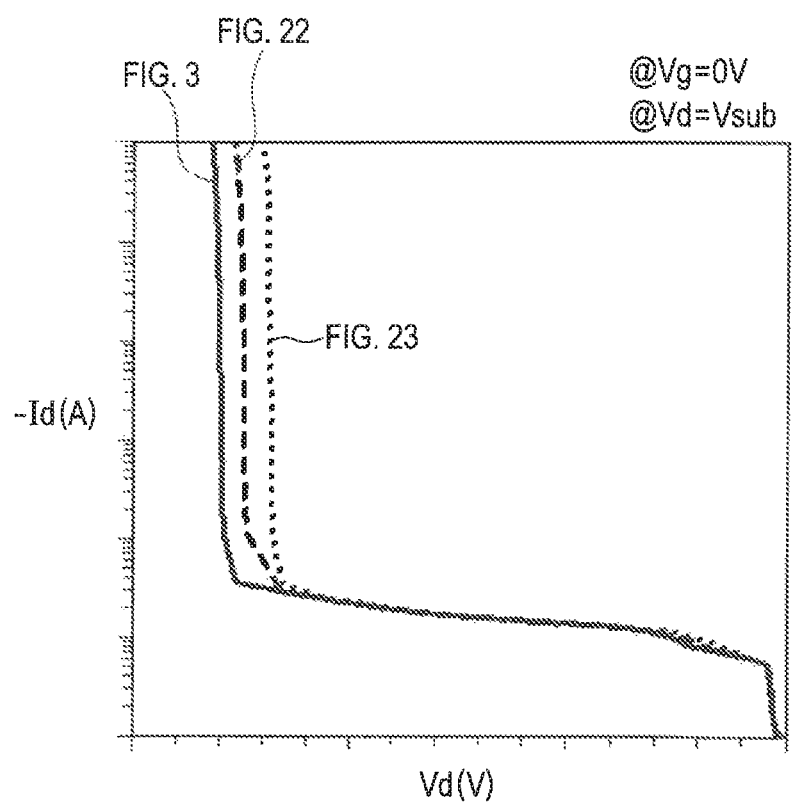
FIG. 24 is a diagram showing Id-Vd waveforms of three structures each in an off state, i.e. the structure according to the first embodiment of the present invention, the structure shown in FIG. 19 and the structure shown in FIG. 20.

The present inventors also measured Id-Vd waveforms in off states of the structures shown in FIGS. 3, 19 and 20, respectively, and the results are shown in FIG. 24.

The structure shown in FIG. 19 is the same as the structure shown in FIG. 3 less the p-type punch-through prevention layer DFT2. Therefore, in the structure shown in FIG. 19, the $p^-$ epitaxial region PEP is in contact with the side wall of the trench DTR of the DTI.

In the structure shown in FIG. 20, the n-type body region NWL extends to the side wall of the trench DTR of the DTI to be in contact with the side wall.

When the n-type body region NWL is extended to the side wall of the trench DTR of the DTI as shown in FIG. 20, the breakdown voltage decreases as shown in FIGS. 23 and 24.

On the other hand, it has been found that, when the $p^-$ epitaxial region PEP is formed, as shown in FIG. 19, between the n-type body region NWL and the trench DTR of the DTI, the breakdown voltage increases compared with that of the structure shown in FIG. 20.

It has also been found that, when, as shown in FIG. 3, the p-type punch-through prevention layer DFT2 and the $p^-$ epitaxial region PEP are formed between the n-type body region NWL and the side wall of the trench DTR of the DTI with the p-type punch-through prevention layer DFT2 being in contact with the side wall of the trench DTR, the breakdown voltage further increases as shown in FIGS. 21 and 24 compared with that of the structure shown in FIG. 19.

The above results are considered explainable as follows.

A region in contact with the side wall of the trench DTR can be easily inverted into an n-type region. When, in the structure shown in FIG. 20, a region in contact with the side wall of the trench DTR is inverted into an n-type region, the n-type body region NWL and the n+ buried region BL can easily be electrically coupled to each other. When the n-type body region NWL and the n+ buried region BL are electrically coupled to each other, the breakdown voltage decreases as described above.

In the structure shown in FIG. 19, the n-type body region NWL is separated from the side wall of the trench DTR with the p⁻ epitaxial region PEP formed between them. Therefore, even if a region in contact with the side wall of the trench DTR is inverted into an n-type region, the n-type body region NWL and the n+ buried region BL are not electrically coupled easily. This can be considered that the structure has an increased breakdown voltage.

In the structure shown in FIG. 3, the p-type punch-through prevention layer DFT2 is in contact with the side wall of the trench DTR, so that the regions in contact with the side wall of the trench DTR are not easily inverted into n-type regions. Hence, in the structure shown in FIG. 3 compared with the structure shown in FIG. 19, the n-type body region NWL and the n+ buried region BL are not easily electrically coupled. This can be considered that the structure has an increased breakdown voltage.

As described above, according to the present embodiment, the n-type body region NWL and the n+ buried region BL are electrically separated by the p-type impurity region PIR as shown in FIG. 3. Thus, the structure shown in FIG. 3 has an increased breakdown voltage compared with the structure shown in FIG. 15A.

According to the present embodiment, the p-type impurity region PIR formed between the n-type body region NWL and the n+ buried region BL as shown in FIG. 3 includes the p-type punch-through prevention layer ISO having a high p-type impurity concentration. The presence of the p-type punch-through prevention layer ISO enhances the effect of electrically isolating the n-type body region NWL and the n+ buried region BL from each other, so that the breakdown voltage of the structure is further increased.

According to the present embodiment, the p-type punch-through prevention layer ISO is formed on the second surface SS side of the n-type body region NWL as shown in FIG. 3. This enhances the effect of electrically isolating the n-type body region NWL and the n+ buried region BL from each other, so that the breakdown voltage of the structure is further increased.

According to the present embodiment, the p-type punch-through prevention layer DFT2 is in contact with the side wall of the trench DTR as shown in FIG. 3, so that the regions in contact with the side wall of the trench DTR are not easily inverted into n-type regions. This further increases the breakdown voltage of the structure.

According to the present embodiment, as shown in FIG. 3, the p-type punch-through prevention layer ISO extends to the p-type drift region DFT1 and entirely covers the second surface SS side of the n-type body region NWL. This further increases the breakdown voltage of the structure.

According to the present embodiment, as shown in FIG. 3, the p-type regions PEP and DFT2 are formed between the n-type body region NWL and the side wall of the trench DTR. This further increases, as described in the foregoing, the breakdown voltage of the structure as compared with the structure shown in FIG. 20.

According to the present embodiment, as shown in FIG. 3, the p-type punch-through prevention layer DFT2 is formed between the n-type body region NWL and the side wall of the trench DTR to be in contact with the side wall of the trench DTR. This further increases, as described in the foregoing, the breakdown voltage of the structure.

According to the present embodiment, as shown in FIG. 8, the p-type drift region DFT1 and the p-type punch-through prevention layer DFT2 are formed by impurity injection performed using a same mask (the first photoresist pattern). This simplifies the manufacturing process compared with cases where the p-type drift region DFT1 and the p-type punch-through prevention layer DFT2 are formed in different processes.

Second Embodiment

Figure 25A:
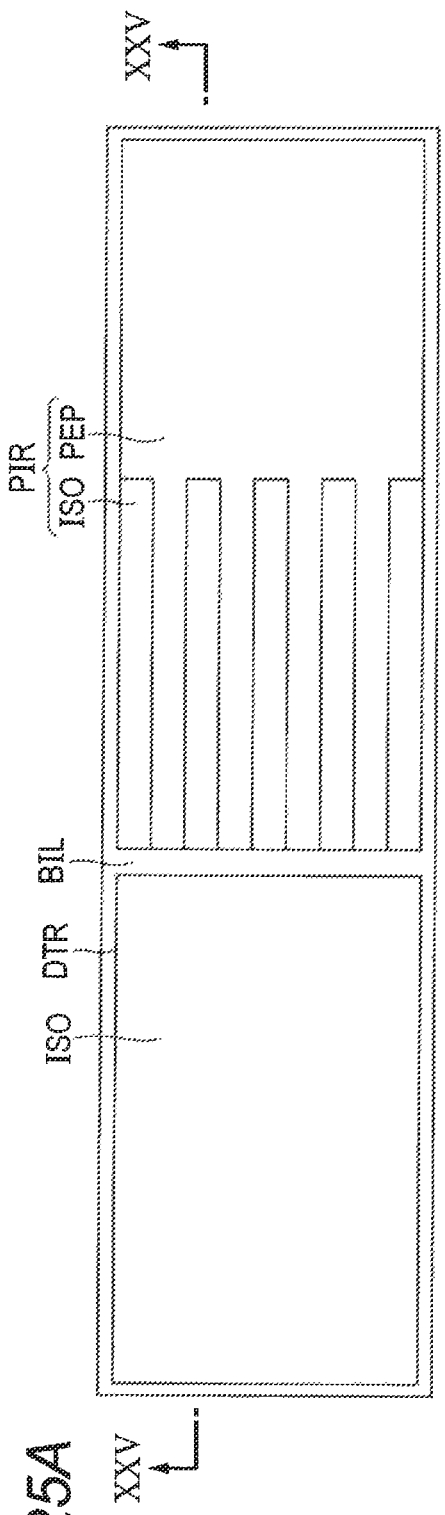
FIG. 25A is a plan view schematically showing the structure of a semi conductor device according to a second embodiment of the present invention.
Figure 25B:
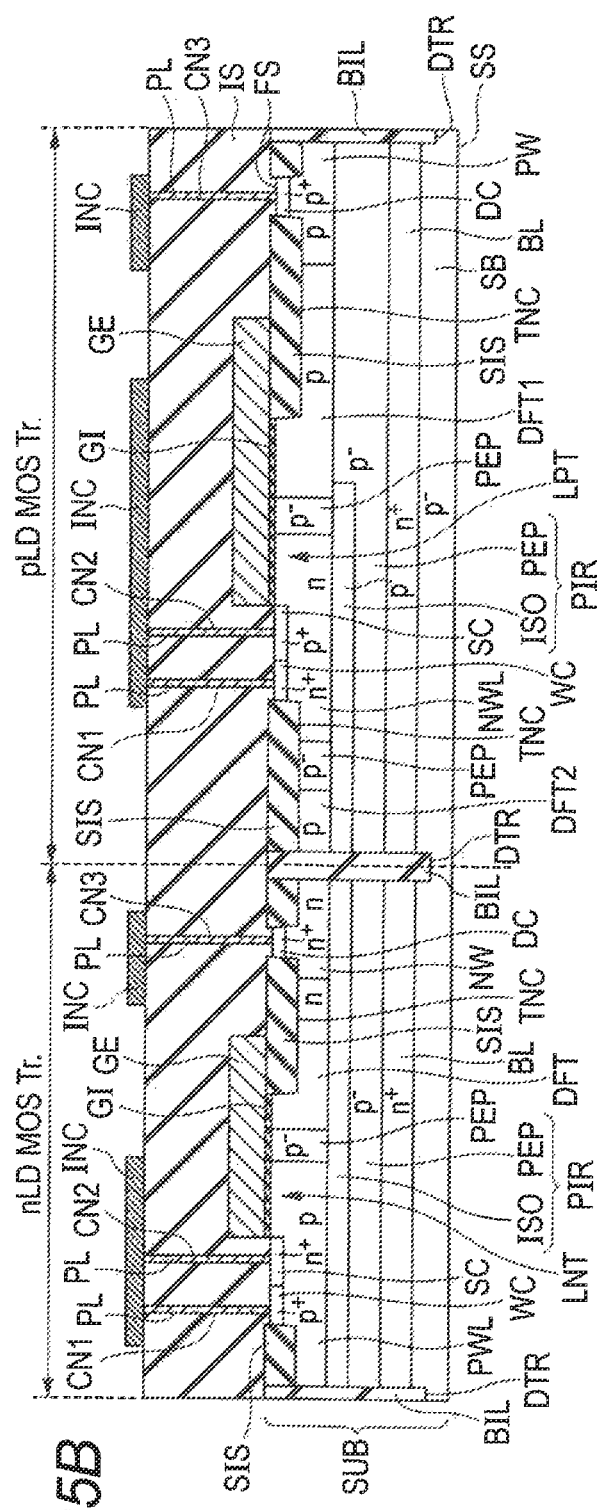
FIG. 25B is a sectional view schematically showing the structure of the semiconductor device according to the second embodiment of the present invention.

The structure as shown in FIGS. 25A and 25B according to a second embodiment of the present invention differs from the structure according to the first embodiment in the formation of the p-type punch-through prevention layer ISO formed in the region where the pLDMOS transistor LPT is formed.

In the second embodiment, plural p-type punch-through prevention layers ISO extend in parallel being mutually spaced apart in planar view as shown in FIG. 25A. The p-type punch-through layers ISO are each strip-shaped in planar view and extend from the side wall of the trench DTR to the p-type drift region DFT1.

On the other hand, in the region where the nLDMOS transistor LNT is formed, the p-type punch-through prevention layer ISO is formed to spread all over the region surrounded by the trench DTR in planar view.

The p-type punch-through prevention layer ISO in the region of the nLDMOS transistor LNT makes up a region formed by impurity injection by which the p-type punch-through prevention layer ISO in the region of the pLDMOS transistor LPT is also formed.

In other respects than those described above, the structure of the present embodiment is almost the same as the structure of the first embodiment, so that elements identical to those of the first embodiment will be denoted by identical symbols as those used in connection with the first embodiment and so that the description of such elements will not be repeated in the following.

According to the present embodiment, in the region where the nLDMOS transistor LNT is formed, the p-type punch-through prevention layer ISO is formed all over the region in planar view. In the region where the pLDMOS transistor is formed, plural p-type punch-through prevention layers ISO are formed being mutually spaced apart in planar view. In this way, it is possible to make different the total quantity of p-type impurities injected into the p-type punch-through prevention layer ISO in the nLDMOS transistor LNT and the total quantity of p-type impurities injected into the p-type punch-through prevention layers ISO in the pLDMOS transistor LPT. This makes it possible to appropriately prevent a punch-through in each of the nLDMOS transistor and the pLDMOS transistor LPT.

According to the present embodiment, the type punch-through prevention layers ISO in the pLDMOS transistor LPT and the p-type punch-through prevention layer ISO in the nLDMOS transistor LNT are formed by impurity injection performed using a same mask. This simplifies the manufacturing process compared with cases where the p-type punch-through prevention layers in different regions are formed in different processes.

The invention made by the present inventors has been described based on embodiments, but the present invention is not limited to the above-described embodiments and can be modified in various ways without departing from the scope of the invention.

What is claimed is:

1. A semiconductor device comprising:
    a semiconductor substrate having a first surface and a second surface opposing each other;
    a first buried region of a first conductivity type, the first buried region being located in the semiconductor substrate and having a floating potential;
    a first body region of the first conductivity type located on a first surface side of the first buried region; and
    a source region of a second conductivity type located in the first surface and forming a p-n junction with the first body region;
    a drain region of the second conductivity type located in the first surface to be away from the source region; and
    a first impurity region of the second conductivity type located between the first buried region and the first body region, the first impurity region being spaced apart from the first surface of the semiconductor substrate, and the first impurity region isolating the first buried region and the first body region from each other,
    wherein the first impurity region comprises:
        a first epitaxial region forming a p-n junction with the first buried region; and
        at least one first high-concentration region having a concentration of impurities of the second conductivity type higher than that of the first epitaxial region, and
    wherein, in a direction from the first surface toward the second surface, the at least one first high-concentration region is located between the first body region and the first buried region such that the at least one first high-concentration region contacts with an entirety of a bottom of the first body region.

2. The semiconductor device according to claim 1, wherein the at least one first high-concentration region is located on a second surface side of the first body region.

3. The semiconductor device according to claim 1,
    wherein a trench is formed in the first surface, the trench extending toward the second surface in side sectional view, and
    wherein the at least one first high-concentration region is in contact with a side wall of the trench.

4. The semiconductor device according to claim 3, further comprising a drift region of the second conductivity type,
    wherein the drift region is located on the first surface side of the first impurity region,
    wherein the drift region has a concentration of impurities of the second conductivity type higher than that of the first epitaxial region, and
    wherein the at least one first high-concentration region extends from a side wall of the trench to the drift region.

5. The semiconductor device according claim 4, comprising an insulating film buried in an isolation trench formed between the source region and the drain region,
    wherein the isolation trench is shallower from the first surface than the trench, and
    wherein, in plan view, an edge portion of the at least one first high-concentration region overlaps with an edge portion of the isolation trench.

6. The semiconductor device according to claim 3, further comprising a second high-concentration region of the second conductivity type,
    wherein the second high-concentration region is located between the first body region and the side wall of the trench, and
    wherein the second high-concentration region has a concentration of impurities of the second conductivity type higher than that of the first epitaxial region.

7. The semiconductor device according to claim 1,
    wherein the at least one first high-concentration region is divided into a plurality of first high-concentration regions, and
    wherein the first high-concentration regions extend mutually in parallel in planar view.

8. The semiconductor device according to claim 7, further comprising:
    a first insulated-gate field-effect transistor;
    a second insulated-gate field-effect transistor located away from the first insulated-gate field-effect transistor;
    a second buried region of the first conductivity type, the second buried region being located in the semiconductor substrate and having a floating potential;
    a second body region of the second conductivity type formed on the first surface side of the second buried region; and
    a second impurity region of the second conductivity type located between the second buried region and the second body region and isolating the second buried region and the second body region from each other,
    wherein the second impurity region comprises:
        a second epitaxial region forming a p-n junction with the second buried region; and
        a third high-concentration region having a concentration of impurities of the second conductivity type higher than that of the second epitaxial region and located on the first surface side of the second epitaxial region, and
    wherein, in planar view, the third high-concentration region is formed all over a region where the second insulated-gate field-effect transistor is formed.

9. A method for manufacturing a semiconductor device, the semiconductor device manufacturing method comprising:
    forming a first buried region of a first conductivity type, the first buried region having a floating potential, the first buried region being formed in a semiconductor substrate having a first surface and a second surface, the first surface and the second surface opposing each other;
    forming a first body region of the first conductivity type on a first surface side of the first buried region;
    forming, in the first surface, a source region of a second conductivity type, the source region forming a p-n junction with the first body region, and a drain region of the second conductivity type, the drain region being located away from the source region; and
    forming a first impurity region of the second conductivity type between the first buried region and the first body region, the first impurity region spaced apart from the first surface of the semiconductor substrate, and the first impurity region isolating the first buried region and the first body region from each other,
    wherein forming the first impurity region comprises:

forming an epitaxial region forming a p-n junction with the first buried region, and forming a first high-concentration region having a concentration of impurities of the second conductivity type higher than that of the epitaxial region, and wherein, in a direction from the first surface toward the second surface, the first high-concentration region is located between the first body region and the first buried region such that the first high-concentration region contacts with an entirety of a bottom surface of the first body region.

10. The semiconductor device manufacturing method according to claim 9, further comprising:

forming a trench in the first surface, the trench extending toward the second surface as seen in side sectional view;

forming a second high-concentration region of the second conductivity type, the second high-concentration region being located between the first body region and a side wall of the trench, the second high-concentration region having a concentration of impurities of the second conductivity type higher than that of the epitaxial region; and forming a drift region of the second conductivity type on the first surface side of the first impurity region, the drift region having a concentration of impurities of the second conductivity type higher than that of the epitaxial region, wherein the second high-concentration region and the drift region are formed by impurity injection performed using a same mask.

11. The semiconductor device manufacturing method according claim 10, comprising:

forming an isolation trench between the source region and the drain region; and burying an insulating film in the isolation trench formed, wherein the isolation trench is shallower from the first surface than the trench, and wherein, in plan view, an edge portion of the first high-concentration region overlaps with an edge portion of the isolation trench.

12. The semiconductor device manufacturing method according to claim 9, further comprising forming a third high-concentration region in a region where a second insulated-gate field-effect transistor is formed spaced apart from a first insulated-gate field-effect transistor, wherein the third high-concentration region is formed by impurity injection by which a first high-concentration region is also formed such that, in planar view, the third high-concentration region is formed all over the region where the second insulated-gate field-effect transistor is formed.

* * * * *